(12) United States Patent
Kadowaki et al.

(10) Patent No.: US 7,259,418 B2
(45) Date of Patent: Aug. 21, 2007

(54) SEMICONDUCTOR DEVICE INCLUDING A MISFET AND A MIS CAPACITOR

(75) Inventors: Tadashi Kadowaki, Osaka (JP); Hiroyuki Umimoto, Hyogo (JP); Takato Handa, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 80 days.

(21) Appl. No.: 10/896,899

(22) Filed: Jul. 23, 2004

(65) Prior Publication Data

US 2005/0045888 A1 Mar. 3, 2005

(30) Foreign Application Priority Data

Aug. 28, 2003 (JP) .............................. 2003-304715

(51) Int. Cl.
*H01L 29/93* (2006.01)
(52) U.S. Cl. ................. 257/312; 257/601; 257/E29.344
(58) Field of Classification Search ................. 257/296, 257/312, 480, 532, 595–602, E29.344
See application file for complete search history.

(56) References Cited

U.S. PATENT DOCUMENTS 6,034,388 A * 3/2000 Brown et al. ............... 257/296
6,194,279 B1 * 2/2001 Chen et al. ................. 438/303
6,653,716 B1 * 11/2003 Vashchenko et al. ....... 257/596
6,703,297 B1 * 3/2004 Hellig ......................... 438/585
6,858,918 B2 * 2/2005 Maeda et al. ............... 257/595
2003/0052389 A1 * 3/2003 Maeda et al. ............... 257/595

FOREIGN PATENT DOCUMENTS

JP 9-121025 5/1997

* cited by examiner

*Primary Examiner*—Marcos D. Pizarro
(74) *Attorney, Agent, or Firm*—McDermott Will & Emery LLP

(57) ABSTRACT

A semiconductor device comprises varactor regions Va and transistor regions Tr. An active region for a varactor is formed with a substrate contact impurity diffusion region obtained by doping an N well region with N-type impurity at a relatively high concentration. However, any extension region (or LDD region) as in a varactor of a known semiconductor device is not formed in the active region for a varactor. On the other hand, parts of a P well region located to both sides of the polysilicon gate electrode in the transistor region Tr are formed with high-concentration source/drain regions and extension regions. Therefore, the extendable range of a depletion layer is kept wide to extend the capacitance variable range of the varactor.

20 Claims, 13 Drawing Sheets

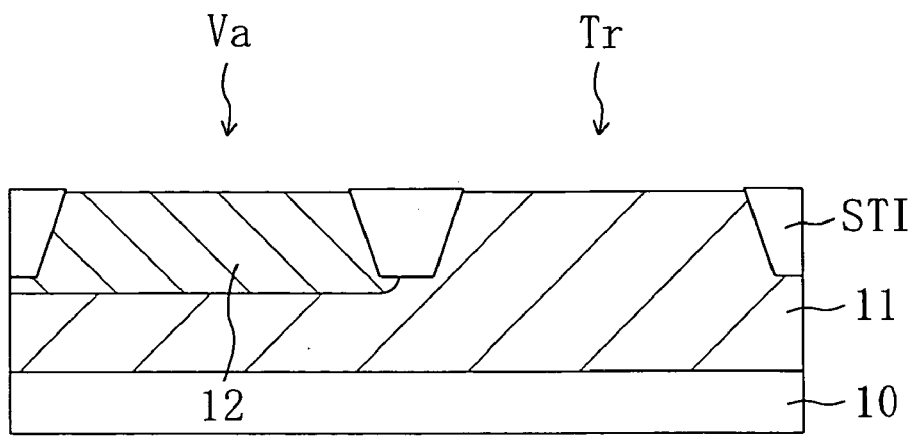
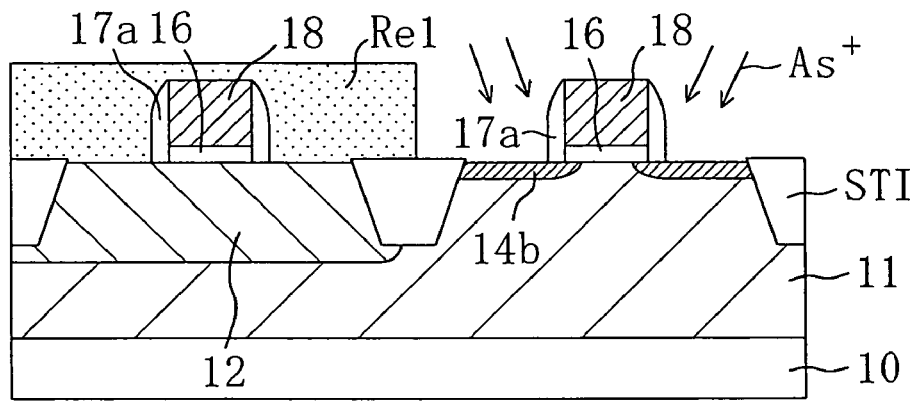
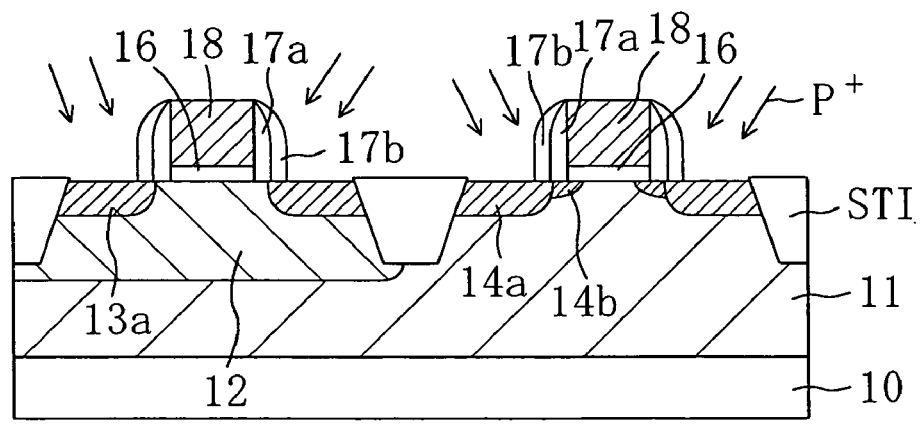
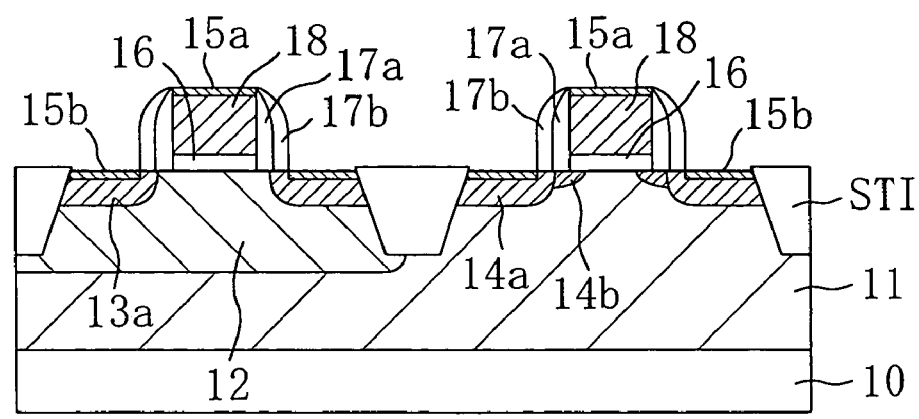

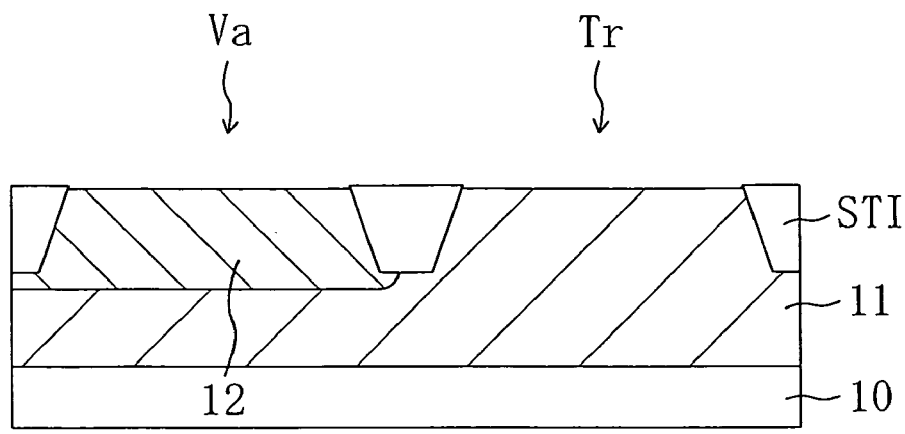
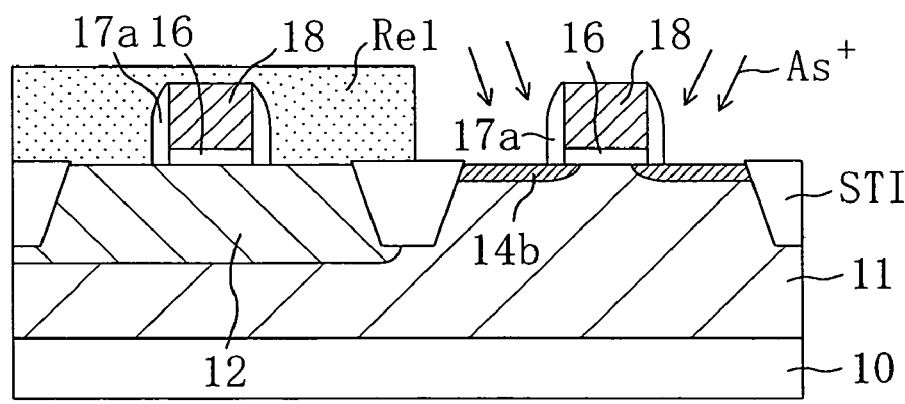
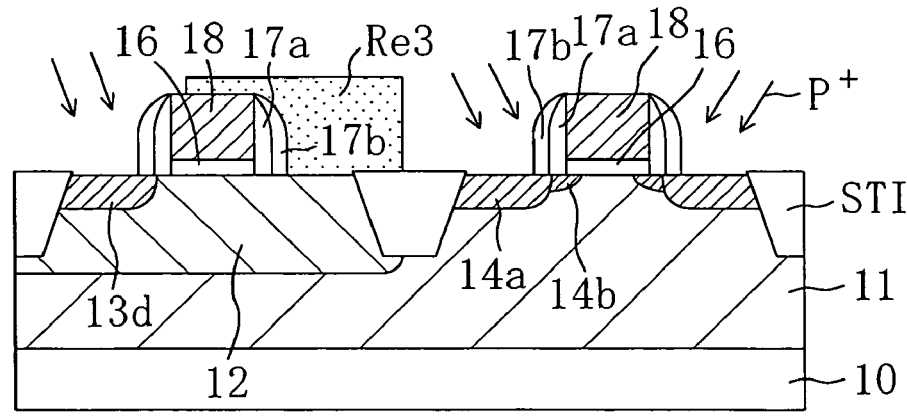
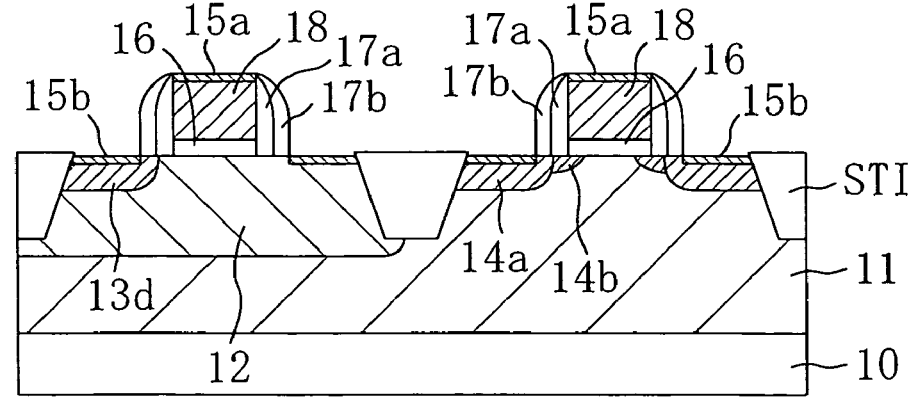

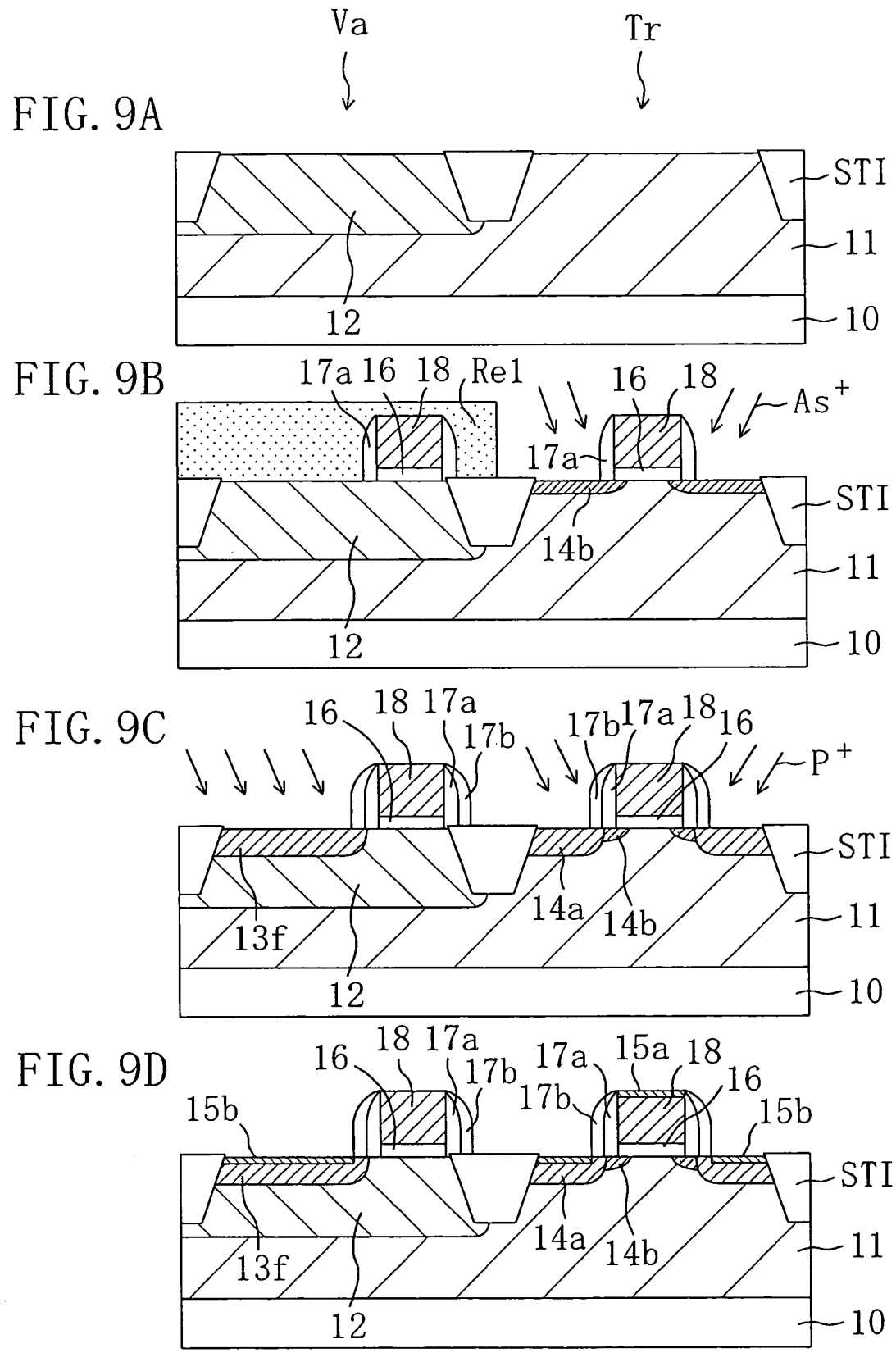

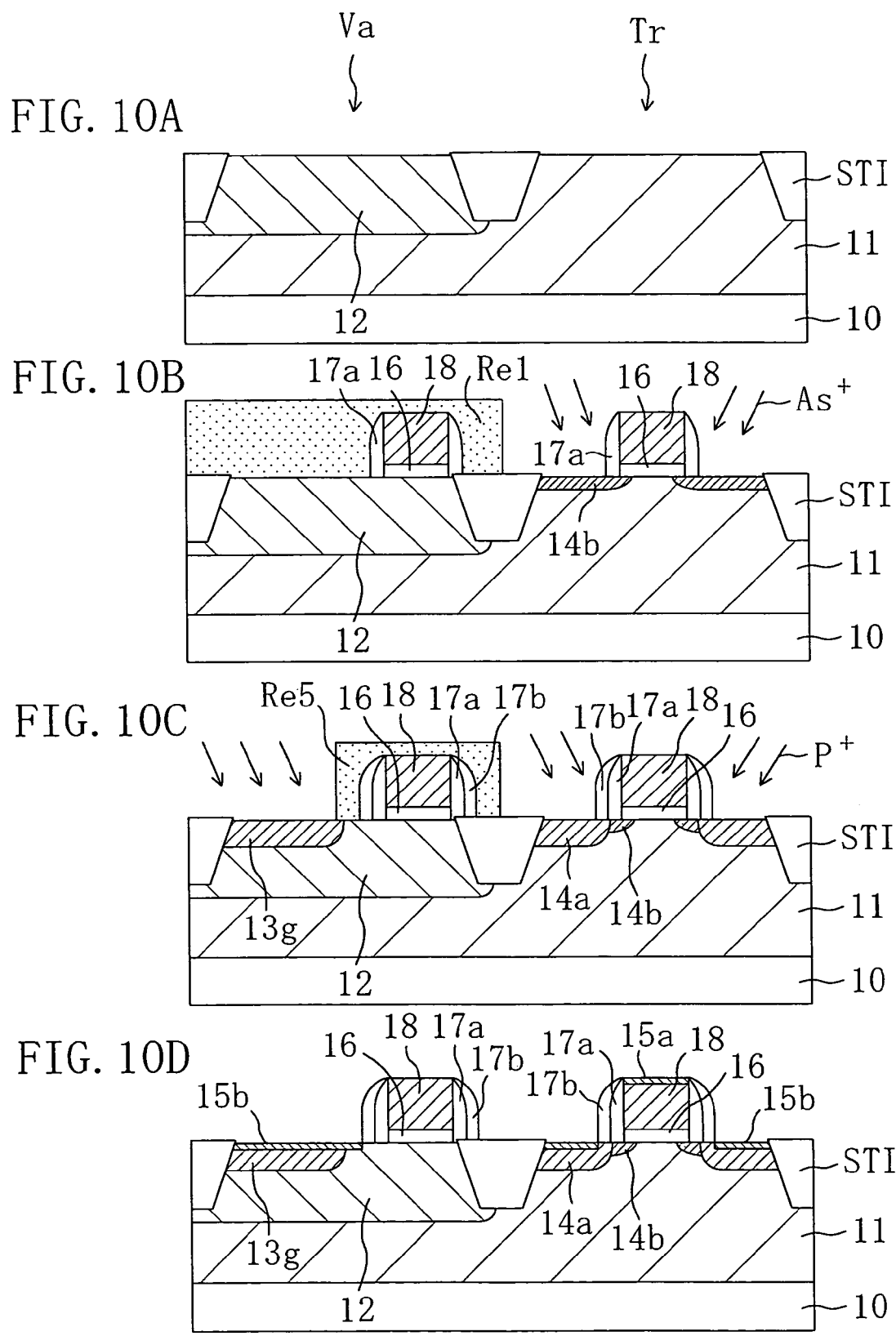

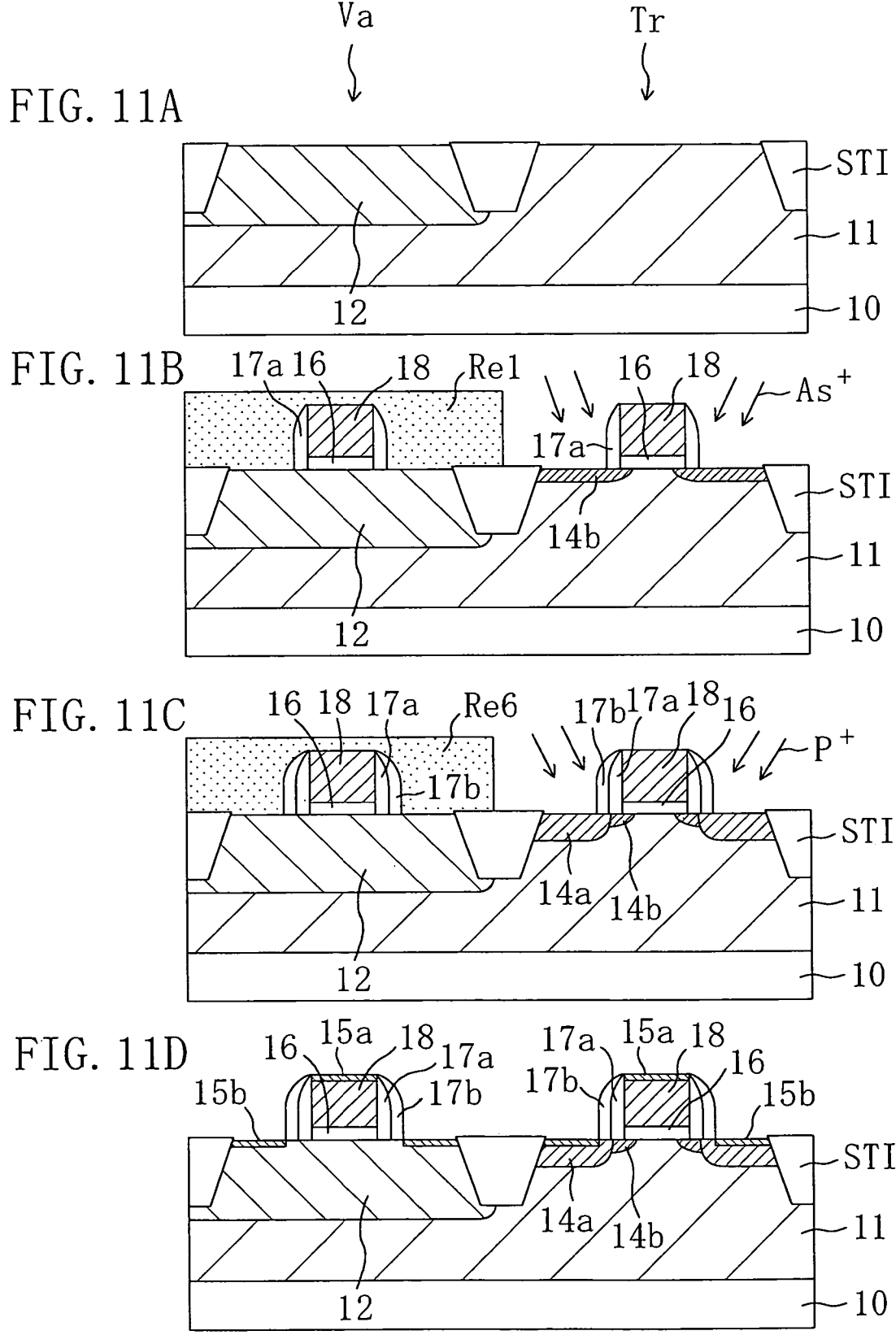

SEMICONDUCTOR DEVICE INCLUDING A MISFET AND A MIS CAPACITOR

BACKGROUND OF THE INVENTION (1) Field of the Invention

The present invention relates to a voltage-variable capacitor (varactor) used for a radio frequency (RF) circuit such as a voltage-controlled oscillator, and more particularly relates to a MIS capacitor fabricated using an existing CMOS process.

(2) Description of Related Art

Varactors that are voltage-variable capacitors have conventionally been widely used for many radio frequency (RF) circuits. One of known devices for realizing varactors is a device utilizing the depletion layer capacitance of a PN junction, more specifically a varactor diode.

Tuning ratio (TR) representing the ratio between the capacitance C2 at a reverse bias voltage of zero and the capacitance C1 at a predetermined reverse bias voltage is often used as an index for evaluating performance of varactors. Larger tuning ratio (C2/C1) allows significant change in the varactor capacitance even within the same gate voltage width. Thus, the controllable resonant frequency range of an antenna becomes wider.

FIG. 13 is a graph showing the bias dependence of the capacitance of a PN diode. The increase in reverse bias Vg increases the width of the depletion layer in the PN diode. Thus, the capacitance C1 decreases. The width of the depletion layer depends on the concentration of P-type and N-type impurities. Hence, the width of the depletion layer becomes narrower with increase in doping amount, resulting in the increased capacitance of the PN diode.

In recent years, smaller circuits are being highly demanded, and thus it has been desired to mount a varactor and a CMOS device on one chip. Therefore, existing CMOS process are used to form MIS capacitors serving as varactors.

FIG. 14 is a cross-sectional view showing the structure of a known semiconductor device in which a CMOS device and a varactor (MIS capacitor) are mounted on a common substrate.

As shown in this figure, the known semiconductor device includes an STI (Shallow Trench Isolation) structure partitioning the surface of a semiconductor substrate 100 that is a Si substrate into a plurality of active regions. The plurality of active regions comprise transistor regions Tr to be formed with MISFETs of the CMOS device and varactor regions Va to be formed with varactors. Although the MISFETs of the CMOS device include an NMISFET and a PMISFET, this figure shows only a region of the semiconductor device to be formed with an NMISFET.

The semiconductor substrate 110 is formed with a P well region 111 doped with a P-type impurity and an N well region 112 obtained by doping a part of the P well region 111 with an N-type impurity. The N well region 112 shown in FIG. 14 is an active region for a varactor. A gate dielectric 116 of a silicon oxide film, a polysilicon gate electrode 118 doped with an N-type impurity, a sidewall 117 of a silicon oxide film are provided on the semiconductor substrate 110 in each of the varactor region Va and the transistor region Tr. Parts of the N well region 112 located to both sides of the polysilicon gate electrode 118 in the varactor region Va are formed with substrate contact impurity diffusion regions 113a doped with an N-type impurity at a relatively high concentration and extension regions 113b doped with an N-type impurity at an intermediate concentration. Parts of the P well region 111 located to both sides of the polysilicon gate electrode 118 in the transistor region Tr are formed with high-concentration source/drain regions 114a doped with an N-type impurity at a relatively high concentration and extension regions 114b doped with an N-type impurity at an intermediate concentration. Each of the varactor region Va and the transistor region Tr is formed with an on-gate silicide layer 115a and on-diffusion-region silicide layers 115b through a salicide process.

Briefly speaking, the structure of the semiconductor device shown in FIG. 14 is formed through the following fabricating process steps. First, an STI structure, a P well region 111 and an N well region 112 are formed in a semiconductor substrate 110. Then, a common gate dielectric 116 and a common polysilicon gate electrode 118 are formed in each of a varactor region Va and a transistor region Tr. Thereafter, N-type impurity ions are implanted into the N well region 112 and the P well region 111 at an intermediate concentration by using the polysilicon gate electrodes 118 as masks to form extension regions 113b and 114b. Next, a silicon oxide film is deposited on the substrate, and thereafter anisotropic etching is performed to form sidewalls 117 covering the sides of the polysilicon gate electrodes 118. Furthermore, impurity ions are implanted into the N well region 112 and the P well region 111 at a relatively high concentration by using the polysilicon gate electrode 118 and the sidewall 117 as masks, thereby forming substrate contact impurity diffusion regions 113a in the varactor region Va and high-concentration source/drain regions 114a in the transistor region Tr. Thereafter, both the varactor region Va and the transistor region Tr are subjected to a salicide process to form an on-gate silicide layer 115a on each polysilicon gate electrode 118 and an on-diffusion-layer silicide layer 115b on each of the substrate contact impurity diffusion regions 113a and the high-concentration source/drain regions 114a.

With the structure of the semiconductor device shown in FIG. 14, each of members in the varactor region Va can be formed by utilizing the existing process for fabricating a CMOS device.

SUMMARY OF THE INVENTION

However, the varactor having the above-described known structure formed using the existing CMOS process has the following problem.

In the varactor region Va, the substrate contact impurity diffusion regions 113a and the extension regions 113b serve as substrate contact impurity diffusion regions. Both the substrate contact impurity diffusion regions 113a and the extension regions 113b contain an N-type impurity at a higher concentration than the N well region 112. Therefore, when a voltage (bias) is applied between the polysilicon gate electrode 118 and the substrate contact impurity diffusion regions 113a, a depletion layer formed below the gate is restrained from extending in the direction parallel to the principal surface of the semiconductor substrate 110 (horizontal direction). More particularly, the gate length and width of the polysilicon gate electrode 118 define the extendable range of the depletion layer. Thus, as the gate length of the polysilicon gate electrode of the varactor is shortened in order to downsize the semiconductor device, the extendable range of the depletion layer becomes narrower. Therefore, the capacitance C2 at a reverse bias of zero would increase.

FIG. 15 is a graph showing the gate-length dependence of the tuning ratio of a varactor in a semiconductor device formed through known fabricating process steps. As shown in this figure, the tuning ratio C2/C1 is degraded as the gate length Lg becomes shorter. A varactor having a short gate length cannot provide desired varactor performance.

An object of the present invention is to provide, in spite of using an existing CMOS process, a semiconductor device in which a small-area and high-performance varactor having a wide extendable range of a depletion layer below a gate electrode is combined with a CMOS device and a fabrication method thereof.

According to a semiconductor device of the present invention, a MISFET and a MIS capacitor are placed on a first active region and a second active region, respectively. While the MIS capacitor is formed with at least one substrate contact region, it is formed with no impurity diffusion region substantially equal in impurity concentration to low-concentration impurity diffusion regions of the MISFET.

In this way, there does not exist in the MIS capacitor of the semiconductor device any impurity diffusion region that would conventionally be formed simultaneously with extension regions and LDD regions of the MISFET and contains an impurity at a low concentration. Thus, on application of a gate bias, the extendable range of a depletion layer below a gate electrode can be kept wide enough. Hence, when the MIS capacitor is used as a varactor, the variable capacitance range can be kept wide enough even for reduction in the gate length according to miniaturization in the semiconductor device.

Preferably, the MIS capacitor includes, as the at least one substrate contact region, at least one substrate contact impurity diffusion region substantially equal in impurity concentration to a source/drain region of the MISFET, and no impurity diffusion region containing a first conductivity type impurity at a low concentration is formed between the substrate contact region and a part of the second active region located immediately below the gate electrode.

Furthermore, it is preferable that the substrate contact impurity diffusion region does not overlap with the gate electrode in a plan view. In addition, it is more preferable that the substrate contact impurity diffusion region is apart from a part of the second active region located below one side of the gate electrode and does not overlap with a sidewall in a plan view.

It is more preferable that the at least one substrate contact region is formed in the second active region only between one side of the gate electrode and one of isolation trenches, because the extendable range of the depletion layer can further be extended.

It is more preferable that a sidewall of the MIS capacitor is at least partly provided on one said isolation trench and the at least one substrate contact region in the MIS capacitor is formed only between one side of the gate electrode and another said isolation trench.

It is preferable that each of the MISFET and the MIS capacitor further comprises an offset spacer interposed between its gate electrode and its sidewall, because the extendable range of the depletion layer in the MIS capacitor can further be extended.

In this case, it is preferable that the substrate contact impurity diffusion region does not overlap with the offset spacer in a plan view.

It is more preferable that a part of the offset spacer covering one side of the gate electrode in the MIS capacitor is provided on one said isolation trench and the at least one substrate contact impurity diffusion region is formed only between the other side of the gate electrode and another said isolation trench.

The MIS capacitor may include, as the at least one substrate contact region, at least one silicide layer formed in the top of the second active region, and the second active region may be formed with neither impurity diffusion region substantially equal in impurity concentration to the source/drain region of the MISFET nor impurity diffusion region substantially equal in impurity concentration to the low-concentration impurity diffusion regions of the MISFET.

A semiconductor device fabrication method of the present invention is a method for fabricating a semiconductor device in which a MISFET and a MIS capacitor substantially equal in gate length of a gate electrode to each other are provided on a first active region and a second active region of a substrate, respectively. The method comprises the steps of, when a first impurity of a first conductive type is implanted into the first active region to form low-concentration impurity diffusion regions of the MISFET, forming a sidewall of each gate electrode with the second active region covered with a mask, and thereafter implanting a second impurity of a first conductive type into the first and second active regions at a higher concentration than that of the first impurity by using, as masks, at least gate electrodes and sidewalls of the MISFET and the MIS capacitor.

With this method, the MIS capacitor of the semiconductor device is formed with no impurity diffusion region which would conventionally be formed simultaneously with extension regions and LDD regions of the MISFET and contains an impurity at a low concentration. Thus, in the formed semiconductor device, the extendable range of the depletion layer below a gate electrode can be kept wide enough on application of a gate bias. Hence, when the MIS capacitor is used as a varactor, the variable capacitance range can be kept wide enough even for reduction in the gate length according to miniaturization in the semiconductor device.

When an impurity is implanted into the active regions to form the source/drain regions of the MISFET, a part of the second active region that should be formed with no substrate contact impurity diffusion region need be covered with a resist film.

In particular, the gate electrode can be formed on one end of the second active region.

At least one silicide layer can only be formed as a substrate contact region without the formation of a substrate contact impurity diffusion region in the second active region.

According to the semiconductor device and the method for fabricating the same of the present invention, the MIS capacitor is provided with no low-concentration impurity diffusion regions existing in the MISFET. Thus, the depletion layer can be extended and a varactor element having a short gate length can be improved in its performance.

BRIEF DESCRIPTION OF THE DRAWINGS

FIGS. 2A through 2D are cross-sectional views illustrating process steps for fabricating the semiconductor device according to the first embodiment.

FIGS. 6A through 6D are cross-sectional views illustrating process steps for fabricating the semiconductor device according to the third embodiment.

FIGS. 9A through 9D are cross-sectional views illustrating process steps for fabricating a semiconductor device according to a fifth embodiment.

FIGS. 10A through 10D are cross-sectional views illustrating process steps for fabricating a semiconductor device according to a sixth embodiment.

FIGS. 11A through 11D are cross-sectional views illustrating process steps for fabricating a semiconductor device according to a seventh embodiment.

DETAILED DESCRIPTION OF THE INVENTION

EMBODIMENT 1

Figure 1:
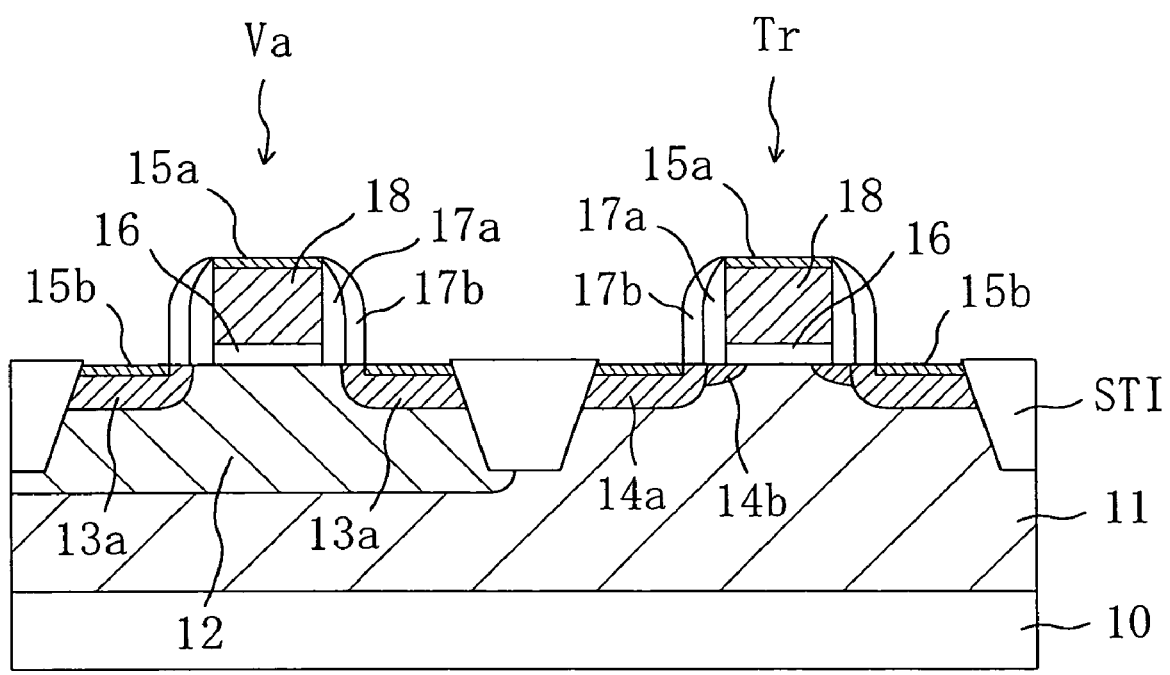
FIG. 1 is a cross-sectional view showing the structure of a semiconductor device according to a first embodiment in which a varactor (MIS capacitor) is combined with a CMOS device.

FIG. 1 is a cross-sectional view showing the structure of a semiconductor device according to a first embodiment in which a varactor (MIS capacitor) is combined with a CMOS device. The semiconductor device of this embodiment includes an STI (Shallow Trench Isolation) structure partitioning the surface of a semiconductor substrate 10 that is a Si substrate into a plurality of active regions. The plurality of active regions comprise transistor regions Tr to be formed with MISFETs of the CMOS device and varactor regions Va to be formed with varactors. Although the MISFETs of the CMOS device include an NMISFET and a PMISFET, this figure shows only a region of the semiconductor device to be formed with an NMISFET.

The semiconductor substrate 10 is formed with a P well region 11 doped with a P-type impurity and an N well region 12 obtained by doping a part of the P well region 11 with an N-type impurity. The N well region 12 shown in FIG. 1 is an active region for a varactor. In each of the varactor region Va and the transistor region Tr, the semiconductor substrate 10 is provided with a gate dielectric 16 of a silicon oxide film, a polysilicon gate electrode 18 doped with an N-type impurity, an implantation offset spacer 17a of a silicon oxide film covering the sides of the polysilicon gate electrode 18, and a sidewall 17b of a silicon oxide film covering the surface of the implantation offset spacer 17a. The gate dielectric 16, the polysilicon gate electrode 18, the implantation offset spacer 17a, and the sidewall 17b in the varactor region Va are substantially equal to those in the transistor region Tr in material composition and dimension along the gate length direction, respectively. "Substantially equal" means that the formers are equal to the latters if variations that may inevitably be produced depending on lots of in fabrication processes and sites on a wafer are ignored. More particularly, it means that both the regions are equal to each other in their design materials and dimensions.

Substrate contact impurity diffusion regions 13a doped with an N-type impurity at a relatively high concentration are formed in parts of the N well region 12 located to both sides of the polysilicon gate electrode 18 in the varactor region Va. However, extension regions (or lightly doped drain (LDD) regions) are not formed unlike the varactor of the known semiconductor device. This is a feature of the varactor of the semiconductor device according to this embodiment.

On the other hand, like the transistor of the known semiconductor device, there are formed, in parts of the P well region 11 located to both sides of the polysilicon gate electrode 18 in the transistor region Tr, high-concentration source/drain regions 14a doped with an N-type impurity at a relatively high concentration and extension regions 14b doped with an N-type impurity at an intermediate concentration. Each of the varactor region Va and the transistor region Tr is formed with an on-gate silicide layer 15a and on-diffusion-region silicide layers 15b through a salicide process.

The N-type impurity-doped substrate contact impurity diffusion region 13a in the varactor region Va is substantially equal in impurity concentration to the high-concentration source/drain regions 14a in the NMISFET of the transistor region Tr. Furthermore, as described above, the varactor region Va is provided with no impurity diffusion region substantially equal in impurity concentration to each extension region 14b of the NMISFET in the transistor region Tr. In this case, "substantially equal in impurity concentration" means that if variations that may inevitably be produced depending on lots of fabrication processes and sites on a wafer are ignored, the impurity diffusion region is equal in impurity concentration to the extension region 14b. More particularly, it means that ions are simultaneously implanted into the N well region 12 in the varactor region Va and the P well region 11 in the transistor region Tr, or the set ion implantation conditions in both the regions are the same.

FIGS. 2A through 2D are cross-sectional views illustrating process steps for fabricating the semiconductor device according to the first embodiment.

First, in a process step shown in FIG. 2A, an N-type impurity such as phosphorus is implanted into a part of a P well region 11 that is a part of a semiconductor substrate 10 and is doped with a P-type impurity such as boron (B), thereby forming an N well region 12 for a varactor. The ion implantation conditions in this case are a dose of $1 \times 10^{13}$ cm$^{-2}$ and an acceleration voltage of 640 keV. Furthermore, the STI structure defines a transistor region Tr and a varactor region Va.

Next, in a process step shown in FIG. 2B, a silicon oxide film and a polysilicon film are deposited on the transistor region Tr and the varactor region Va to have thicknesses of approximately 2.8 nm and 180 nm, respectively. Then, an N-type impurity, such as phosphorus, is implanted into the polysilicon film, and thereafter the polysilicon film and the silicon oxide film are patterned, thereby forming a gate dielectric 16 and a polysilicon gate electrode 18. The gate length of the polysilicon gate electrode 18 is 0.15 μm, and the gate width thereof is 1 μm. Next, a silicon oxide film is deposited on the substrate to have a thickness of approximately 10 nm, and thereafter an implantation offset spacer 17a is formed by anisotropic etching to cover the sides of each polysilicon gate electrode 18. Then, a resist film Re1 is formed to cover the varactor region Va, and thereafter N-type impurity ions, such as arsenic ions (As$^+$), are implanted into the transistor region Tr to be formed with an NMISFET, using the resist film Re1 as an implantation mask. The ion implantation conditions in this case are a dose of $7×10^{14}$ cm$^{-2}$, an acceleration voltage of 6 keV, and an angle of 0 degree at which the direction of implantation is tilted. In this manner, while in the transistor region Tr extension regions 14b are formed to self-align with the polysilicon gate electrode 18 and the implantation offset spacer 17a, no extension region is formed in the varactor region Va.

Next, in a process step shown in FIG. 2C, the resist film Re1 is removed. Then, a silicon oxide film is deposited on the substrate to have a thickness of approximately 75 nm, and thereafter anisotropic etching is performed to form sidewalls 17b to cover the surfaces of the implantation offset spacers 17a, respectively. Phosphorus ions (P$^+$) (or arsenic ions) are implanted as an N-type impurity into the varactor region Va and the NMISFET region of the transistor region Tr. The ion implantation conditions are a dose of $6×10^{15}$ cm$^{-2}$, an acceleration voltage of 50 keV, and an angle of 7 degrees at which the direction of implantation is tilted. In this manner, substrate contact impurity diffusion regions 13a are formed in the varactor region Va, and high-concentration source/drain regions 14a are formed in the transistor region Tr.

Next, in a process step shown in FIG. 2D, a generally known salicide process is carried out. This allows an on-gate silicide layer 15a (cobalt silicide layer) to be formed on the polysilicon gate electrode 18 in each of the varactor region Va and the transistor region Tr and also allows on-diffusion-region silicide layers 15b (cobalt silicide layers) to be formed on the substrate contact impurity diffusion regions 13a in the varactor region Va and the high-concentration source/drain regions 14a in the transistor region Tr.

The semiconductor device of this embodiment can include a varactor that can keep a variable capacitance range wide while using the existing CMOS device fabricating process. More particularly, since the substrate contact impurity diffusion regions 13a are formed by ion implantation using the implantation offset spacer 17a, the sidewall 17b and the polysilicon gate electrode 18 as masks, a part of the varactor region Va located below the polysilicon gate electrode 18 constitutes only the N well region 12 containing an N-type impurity at an extremely low concentration. Thus, no extension region for precluding the extension of a depletion layer exists therein. Since the extendable range of the depletion layer can therefore be kept wide, the variable capacitance range of the varactor can be kept wide even for the polysilicon gate electrode 18 having a shortened gate length.

Although in this embodiment the implantation offset spacer 17a is provided to cover the sides of the polysilicon gate electrode 18, the implantation offset spacer 17a is not necessarily required. Even if the sidewall 17b directly covers the sides of the polysilicon gate electrode 18, the extendable range of the depletion layer can be kept as wide as possible, i.e., the basic effect of the present invention can be achieved. However, the provision of the implantation offset spacer 17a shortens the gate length to maintain a high driving force of the MISFET of the CMOS device, while it keeps the distance between the extension regions 14b long to suppress a short channel effect. Simultaneously, a wider variable capacitance range of the varactor can be attained, because the distance between the substrate contact impurity diffusion regions 13a becomes longer.

EMBODIMENT 2

Figure 3:
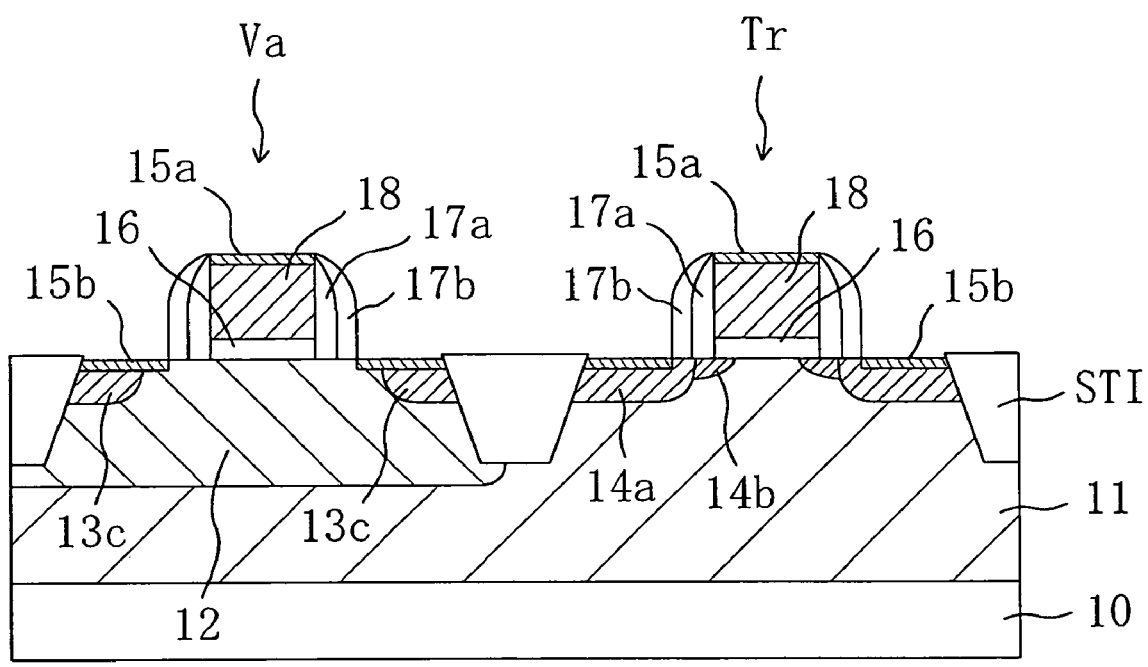
FIG. 3 is a cross-sectional view showing the structure of a semiconductor device according to a second embodiment in which a varactor (MIS capacitor) is combined with a CMOS device.

FIG. 3 is a cross-sectional view showing the structure of a semiconductor device according to a second embodiment in which a varactor (MIS capacitor) is combined with a CMOS device. The semiconductor device of this embodiment includes an STI (Shallow Trench Isolation) structure partitioning the surface of a semiconductor substrate 10 that is a Si substrate into a plurality of active regions. The plurality of active regions comprise transistor regions Tr to be formed with MISFETs of the CMOS device and varactor regions Va to be formed with varactors. Although the MISFETs of the CMOS device include an NMISFET and a PMISFET, this figure shows only a region of the semiconductor device to be formed with an NMISFET.

The semiconductor substrate 10 is formed with a P well region 11 doped with a P-type impurity and an N well region 12 obtained by doping a part of the P well region 11 with an N-type impurity. The N well region 12 shown in FIG. 3 is an active region for a varactor. In each of the varactor region Va and the transistor region Tr, the semiconductor substrate 10 is provided with a gate dielectric 16 of a silicon oxide film, a polysilicon gate electrode 18 doped with an N-type impurity, an implantation offset spacer 17a of a silicon oxide film covering the sides of the polysilicon gate electrode 18, and a sidewall 17b of a silicon oxide film covering the surface of the implantation offset spacer 17a. The gate dielectric 16, the polysilicon gate electrode 18, the implantation offset spacer 17a, and the sidewall 17b in the varactor region Va are substantially equal to those in the transistor region Tr in material composition and dimension along the gate length direction, respectively. "Substantially equal" means that the formers are equal to the latters if variations that may inevitably be produced depending on lots of fabrication processes and sites on a wafer are ignored. More particularly, it means that both the regions are equal to each other in their design materials and dimensions.

Substrate contact impurity diffusion regions 13c doped with an N-type impurity at a relatively high concentration are formed in parts of the N well region 12 apart from parts thereof located immediately below both sides of the polysilicon gate electrode 18 in the varactor region Va. This is a feature of a varactor of the semiconductor device according to this embodiment, which is different from that of the first embodiment. Also in this embodiment, extension regions (or LDD regions) are not formed unlike the varactor of the known semiconductor device.

On the other hand, like the transistor of the known semiconductor device, there are formed, in parts of the P well region 11 located to both sides of the polysilicon gate electrode 18 in the transistor region Tr, high-concentration source/drain regions 14a doped with an N-type impurity at a relatively high concentration and extension regions 14b doped with an N-type impurity at an intermediate concentration. Each of the varactor region Va and the transistor region Tr is formed with an on-gate silicide layer 15a and on-diffusion-region silicide layers 15b through a salicide process.

The N-type impurity-doped substrate contact impurity diffusion region 13c in the varactor region Va is substantially equal in impurity concentration to the high-concentration source/drain regions 14a in the NMISFET of the transistor region Tr. Furthermore, as described above, the varactor region Va is provided with no impurity diffusion region substantially equal in impurity concentration to each extension region 14b of the NMISFET in the transistor region Tr. In this case, "substantially equal in impurity concentration" means that if variations that may inevitably be produced depending on lots of fabrication processes and sites on a wafer are ignored, the impurity diffusion region is equal in impurity concentration to the extension region 14b. More particularly, it means that ions are simultaneously implanted into the N well region 12 in the varactor region Va and the P well region 11 in the transistor region Tr, or the set ion implantation conditions in both the regions are the same.

FIGS. 4A through 4D are cross-sectional views illustrating process steps for fabricating the semiconductor device according to the second embodiment.

Figure 4A:
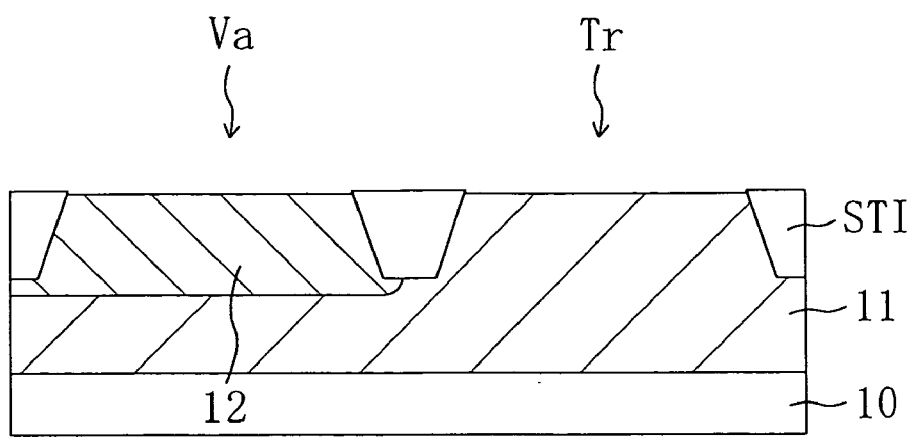
FIGS. 4A through 4D are cross-sectional views illustrating process steps for fabricating the semiconductor device according to the second embodiment.

First, in a process step shown in FIG. 4A, an N-type impurity such as phosphorus is implanted into a part of a P well region 11 that is a part of a semiconductor substrate 10 and is doped with a P-type impurity such as boron (B), thereby forming an N well region 12 for a varactor. The ion implantation conditions in this case are a dose of $1 \times 10^{13}$ cm$^{-2}$ and an acceleration voltage of 640 keV. Furthermore, the STI structure defines a transistor region Tr and a varactor region Va.

Figure 4B:
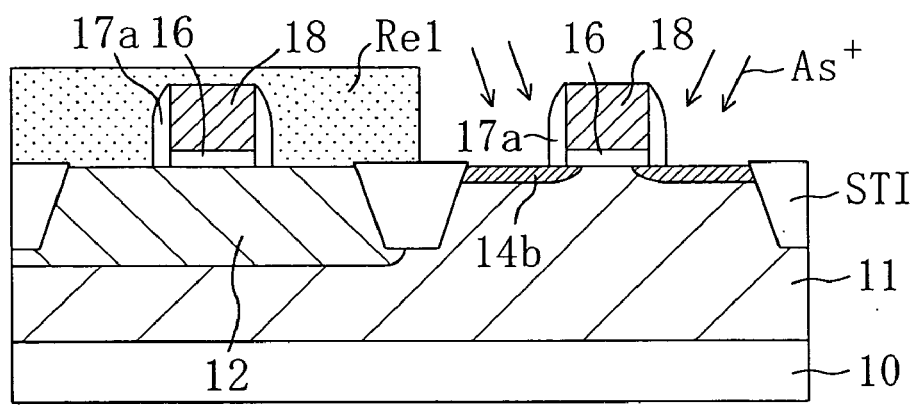

Next, in a process step shown in FIG. 4B, a silicon oxide film and a polysilicon film are deposited on the transistor region Tr and the varactor region Va to have thicknesses of approximately 2.8 nm and 180 nm, respectively. Then, an N-type impurity, such as phosphorus, is implanted into the polysilicon film, and thereafter the polysilicon film and the silicon oxide film are patterned, thereby forming a gate dielectric 16 and a polysilicon gate electrode 18. The gate length of the polysilicon gate electrode 18 is 0.15 μm, and the gate width thereof is 1 μm. Next, a silicon oxide film is deposited on the substrate to have a thickness of approximately 10 nm, and thereafter an implantation offset spacer 17a is formed by anisotropic etching to cover the sides of each polysilicon gate electrode 18. Then, a resist film Re1 is formed to cover the varactor region Va, and thereafter N-type impurity ions, such as arsenic ions (As$^+$), are implanted into the transistor region Tr to be formed with an NMISFET, using the resist film Re1 as an implantation mask. The ion implantation conditions in this case are a dose of $7 \times 10^{14}$ cm$^{-2}$, an acceleration voltage of 6 keV, and an angle of 0 degree at which the direction of implantation is tilted. In this manner, while in the transistor region Tr extension regions 14b are formed to self-align with the polysilicon gate electrode 18 and the implantation offset spacer 17a, no extension region is formed in the varactor region Va.

Figure 4C:
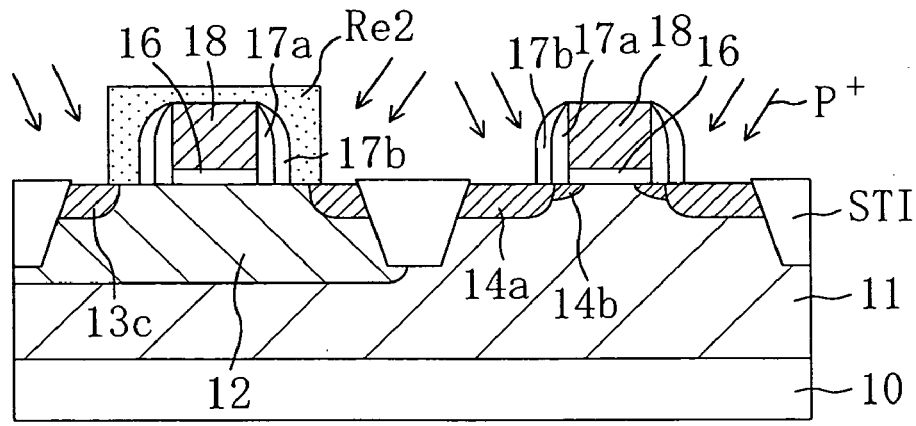

Next, in a process step shown in FIG. 4C, the resist film Re1 is removed. Then, a silicon oxide film is deposited on the substrate to have a thickness of approximately 75 nm, and thereafter anisotropic etching is performed to form sidewalls 17b to cover the surfaces of the implantation offset spacers 17a, respectively. Phosphorus ions (P$^+$) (or arsenic ions) are implanted as an N-type impurity into the varactor region Va and the NMISFET region of the transistor region Tr, using as a mask a resist film Re2 covering the polysilicon gate electrode 18, the implantation offset spacer 17a and the sidewall 17b in the varactor region Va. The ion implantation conditions are a dose of $6 \times 10^{15}$ cm$^{-2}$, an acceleration voltage of 50 keV, and an angle of 7 degrees at which the direction of implantation is tilted. In this manner, substrate contact impurity diffusion regions 13c are formed in parts of the N well region 12 apart from parts thereof located immediately below both sides of the polysilicon gate electrode 18 in the varactor region Va, and high-concentration source/drain regions 14a are formed in the transistor region Tr.

Figure 4D:
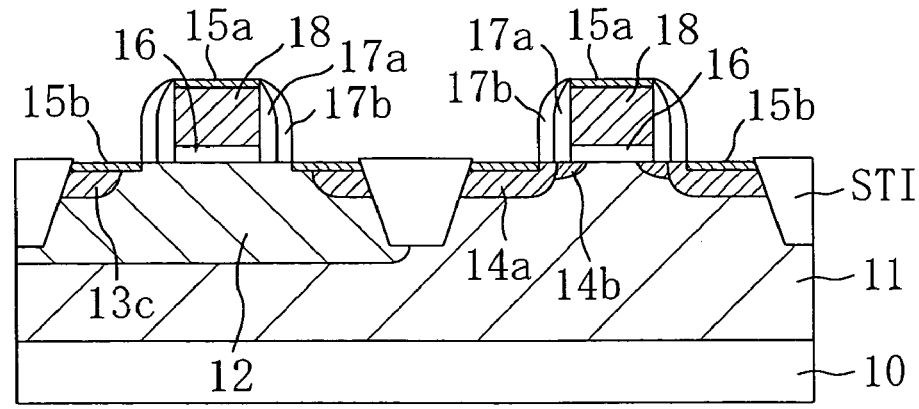

Next, in a process step shown in FIG. 4D, a generally known salicide process is carried out. This allows an on-gate silicide layer 15a (cobalt silicide layer) to be formed on the polysilicon gate electrode 18 in each of the varactor region Va and the transistor region Tr and also allows on-diffusion-region silicide layers 15b (cobalt silicide layers) to be formed on the N well region 12 and the substrate contact impurity diffusion regions 13c in the varactor region Va and the high-concentration source/drain regions 14a in the transistor region Tr.

The semiconductor device of this embodiment can include a varactor that can keep a variable capacitance range wide while using the existing CMOS device fabricating process. More particularly, since the substrate contact impurity diffusion regions 13c are formed by ion implantation using as a mask the resist film Re2 covering the implantation offset spacer 17a, the sidewall 17b and the polysilicon gate electrode 18, a part of the varactor region Va extending from below the polysilicon gate electrode 18 to the vicinity of both sides thereof constitutes only the N well region 12 containing an N-type impurity at an extremely low concentration. Thus, neither of an extension region and a substrate contact impurity diffusion region both for precluding the extension of a depletion layer exists in that part of the varactor region Va. Since the extendable range of the depletion layer can therefore become wider than in the first embodiment, a wider variable capacitance range of the varactor can be attained even for the polysilicon gate electrode 18 having a shortened gate length.

Although in this embodiment the implantation offset spacer 17a is provided to cover the sides of the polysilicon gate electrode 18, the implantation offset spacer 17a is not necessarily required. Even if the sidewall 17b directly covers the sides of the polysilicon gate electrode 18, the extendable range of the depletion layer can be kept as wide as possible, i.e., the basic effect of the present invention can be achieved. However, the provision of the implantation offset spacer 17a shortens the gate length to maintain a high driving force of the MISFET of the CMOS device, while it keeps the distance between the extension regions 14b long to suppress a short channel effect.

EMBODIMENT 3

Figure 5:
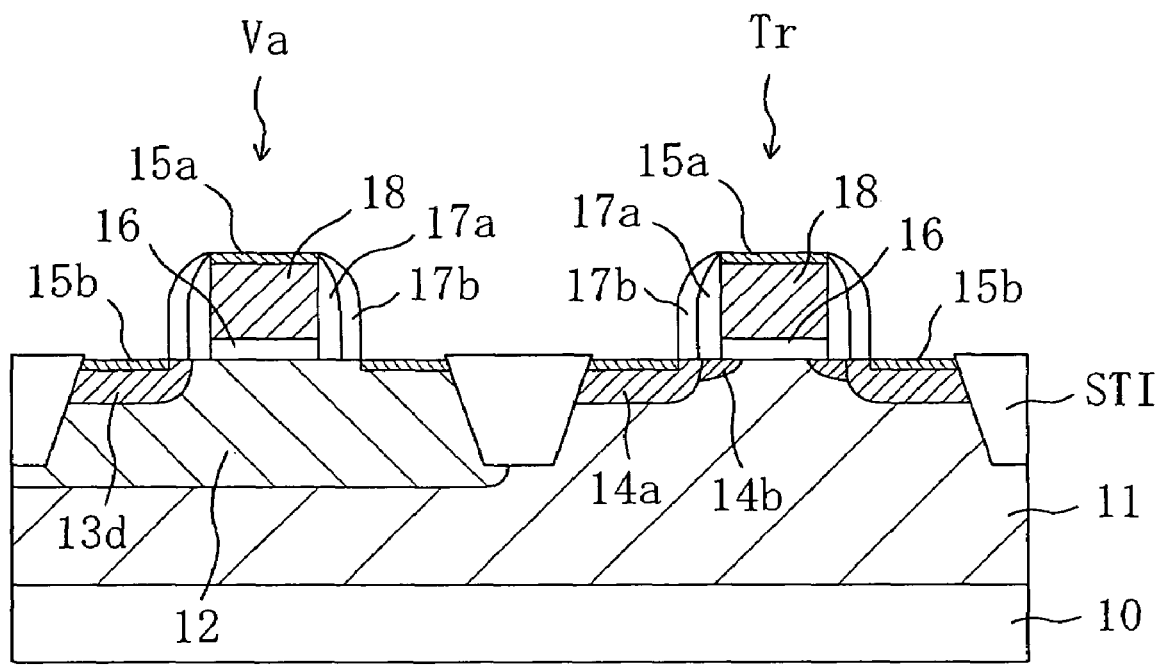
FIG. 5 is a cross-sectional view showing the structure of a semiconductor device according to a third embodiment in which a varactor (MIS capacitor) is combined with a CMOS device.

FIG. 5 is a cross sectional view showing the structure of a semiconductor device according to a third embodiment in which a varactor (MIS capacitor) is combined with a CMOS device. The semiconductor device of this embodiment includes an STI (Shallow Trench Isolation) structure partitioning the surface of a semiconductor substrate 10 that is a Si substrate into a plurality of active regions. The plurality of active regions comprise transistor regions Tr to be formed with MISFETs of the CMOS device and varactor regions Va to be formed with varactors. Although the MISFETs of the CMOS device include an NMISFET and a PMISFET, this figure shows only a region of the semiconductor device to be formed with an NMISFET.

The semiconductor substrate 10 is formed with a P well region 11 doped with a P-type impurity and an N well region 12 obtained by doping a part of the P well region 11 with an N-type impurity. The N well region 12 shown in FIG. 5 is an active region for a varactor. In each of the varactor region Va and the transistor region Tr, the semiconductor substrate 10 is provided with a gate dielectric 16 of a silicon oxide film, a polysilicon gate electrode 18 doped with an N-type impurity, an implantation offset spacer 17a of a silicon oxide film covering the sides of the polysilicon gate electrode 18, and a sidewall 17b of a silicon oxide film covering the surface of the implantation offset spacer 17a. The gate dielectric 16, the polysilicon gate electrode 18, the implantation offset spacer 17a, and the sidewall 17b in the varactor region Va are substantially equal to those in the transistor region Tr in material composition and dimension along the gate length direction, respectively. "Substantially equal" means that the formers are equal to the latters if variations that may inevitably be produced depending on lots of fabrication processes and sites on a wafer are ignored. More particularly, it means that both the regions are equal to each other in their design materials and dimensions.

A substrate contact impurity diffusion region 13d doped with an N-type impurity at a relatively high concentration is formed in a part of the N well region 12 located to one side of the polysilicon gate electrode 18 in the varactor region Va. However, no substrate contact impurity diffusion region is formed in a part of the N well region 12 located to the other side of the polysilicon gate electrode 18. This is a feature of the varactor of the semiconductor device according to this embodiment, which is different from that of the first embodiment. Also in this embodiment, extension regions (or LDD regions) are not formed unlike the varactor of the known semiconductor device.

The N-type impurity-doped substrate contact impurity diffusion region 13d in the varactor region Va is substantially equal in impurity concentration to the high-concentration source/drain regions 14a in NMISFET of the transistor region Tr. Furthermore, as described above, the varactor region Va is provided with no impurity diffusion region substantially equal in impurity concentration to each extension region 14b of the NMISFET in the transistor region Tr. In this case, "substantially equal in impurity concentration" means that if variations that may inevitably be produced depending on lots of fabrication processes and sites on a wafer are ignored, the impurity diffusion region is equal in impurity concentration to the extension region 14b. More particularly, it means that ions are simultaneously implanted into the N well region 12 in the varactor region Va and the P well region 11 in the transistor region Tr, or the set ion implantation conditions in both the regions are the same.

On the other hand, like the transistor of the known semiconductor device, there are formed, in parts of the P well region 11 located to both sides of the polysilicon gate electrode 18 in the transistor region Tr, high-concentration source/drain regions 14a doped with an N-type impurity at a relatively high concentration and extension regions 14b doped with an N-type impurity at an intermediate concentration. Each of the varactor region Va and the transistor region Tr is formed with an on-gate silicide layer 15a and on-diffusion-region silicide layers 15b through a salicide process.

FIGS. 6A through 6D are cross-sectional views illustrating process steps for fabricating the semiconductor device according to the third embodiment.

First, in a process step shown in FIG. 6A, an N-type impurity such as phosphorus is implanted into a part of a P well region 11 that is a part of a semiconductor substrate 10 and is doped with a P-type impurity such as boron (B), thereby forming an N well region 12 for a varactor. The ion implantation conditions in this case are a dose of $1 \times 10^{13}$ cm$^{-2}$ and an acceleration voltage of 640 keV. Furthermore, the STI structure defines a transistor region Tr and a varactor region Va.

Next, in a process step shown in FIG. 6B, a silicon oxide film and a polysilicon film are deposited on the transistor region Tr and the varactor region Va to have thicknesses of approximately 2.8 nm and 180 nm, respectively. Then, an N-type impurity, such as phosphorus, is implanted into the polysilicon film, and thereafter the polysilicon film and the silicon oxide film are patterned, thereby forming a gate dielectric 16 and a polysilicon gate electrode 18. The gate length of the polysilicon gate electrode 18 is 0.15 µm, and the gate width thereof is 1 µm. Next, a silicon oxide film is deposited on the substrate to have a thickness of approximately 10 nm, and thereafter an implantation offset spacer 17a is formed by anisotropic etching to cover the sides of each polysilicon gate electrode 18. Then, a resist film Re1 is formed to cover the varactor region Va, and thereafter N-type impurity ions, such as arsenic ions (As$^+$), are implanted into the transistor region Tr to be formed with an NMISFET, using the resist film Re1 as an implantation mask. The ion implantation conditions in this case are a dose of $7 \times 10^{14}$ cm$^{-2}$, an acceleration voltage of 6 keV, and an angle of 0 degree at which the direction of implantation is tilted. In this manner, while in the transistor region Tr extension regions 14b are formed to self-align with the polysilicon gate electrode 18 and the implantation offset spacer 17a, no extension region is formed in the varactor region Va.

Next, in a process step shown in FIG. 6C, the resist film Re1 is removed. Then, a silicon oxide film is deposited on the substrate to have a thickness of approximately 75 nm, and thereafter anisotropic etching is performed to form sidewalls 17b to cover the surfaces of the implantation offset spacers 17a, respectively. Phosphorus ions (P$^+$) (or arsenic ions) are implanted as an N-type impurity into the varactor region Va and the NMISFET region of the transistor region Tr, using a resist film Re3 as a mask. The resist film Re3 covers a part of the varactor region Va extending from a location on the polysilicon gate electrode 18 to a location on a trench of the STI structure across a part of the N well region 12 located between one side of the polysilicon gate electrode 18 and the STI structure. The ion implantation conditions are a dose of $6 \times 10^{15}$ cm$^{-2}$, an acceleration voltage of 50 keV, and an angle of 7 degrees at which the direction of implantation is tilted. In this manner, a substrate contact impurity diffusion region 13d is formed in a part of the N well region 12 located to the other side of the polysilicon gate electrode 18 in the varactor region Va.

Next, in a process step shown in FIG. 6D, a generally known salicide process is carried out. This allows an on-gate silicide layer 15a (cobalt silicide layer) to be formed on the polysilicon gate electrode 18 in each of the varactor region Va and the transistor region Tr and also allows on-diffusion-region silicide layers 15b (cobalt silicide layers) to be formed on the N well region 12 and the substrate contact impurity diffusion region 13d in the varactor region Va and the high-concentration source/drain regions 14a in the transistor region Tr.

The semiconductor device of this embodiment can include a varactor that can keep a variable capacitance range wide while using the existing CMOS device fabricating process. More particularly, in the varactor of the semiconductor device of this embodiment, the substrate contact impurity diffusion region 13d is formed by ion implantation using the resist mask Re3 as a mask. The resist film Re3 covers a part of the varactor region Va extending from a location on the polysilicon gate electrode 18 to a location on a trench of the STI structure across a part of the N well region 12 located between one side of the polysilicon gate electrode 18 and the STI structure. Therefore, a part of the varactor region Va located to the one side of the polysilicon gate electrode 18 constitutes only the N well region 12 containing an N-type impurity at an extremely low concentration. Thus, neither of an extension region and a substrate contact impurity diffusion region for precluding the extension of a depletion layer exists in that part of the varactor region Va. Since the extendable range of the depletion layer can therefore become wider than in the first embodiment, a wider variable capacitance range of the varactor can be attained for the polysilicon gate electrode 18 having a shortened gate length.

Although in this embodiment the implantation offset spacer 17a is provided to cover the sides of the polysilicon gate electrode 18, the implantation offset spacer 17a is not necessarily required. Even if the sidewall 17b directly covers the sides of the polysilicon gate electrode 18, the extendable range of the depletion layer can be kept as wide as possible, i.e., the basic effect of the present invention can be achieved. However, the provision of the implantation offset spacer 17a shortens the gate length to maintain a high driving force of the MISFET of the CMOS device, while it keeps the distance between the extension regions 14b long to suppress a short channel effect.

EMBODIMENT 4

Figure 7:
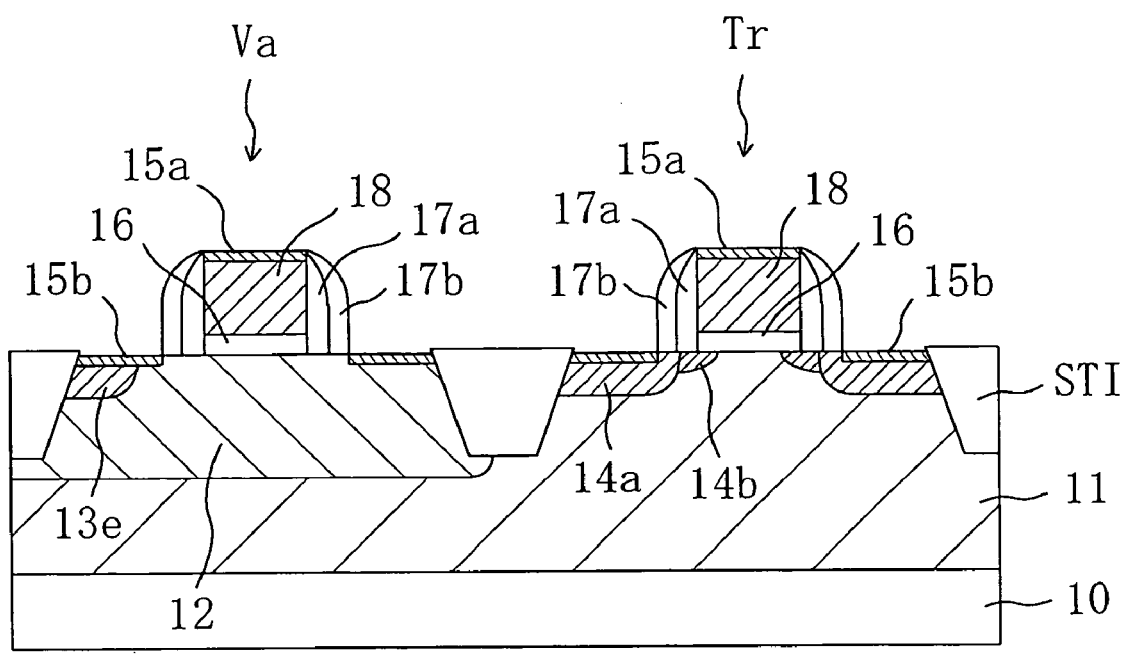
FIG. 7 is a cross-sectional view showing the structure of a semiconductor device according to a fourth embodiment in which a varactor (MIS capacitor) is combined with a CMOS device.

FIG. 7 is a cross-sectional view showing the structure of a semiconductor device according to a fourth embodiment in which a varactor (MIS capacitor) is combined with a CMOS device. The semiconductor device of this embodiment includes an STI (Shallow Trench Isolation) structure partitioning the surface of a semiconductor substrate 10 that is a Si substrate into a plurality of active regions. The plurality of active regions comprise transistor regions Tr to be formed with MISFETs of the CMOS device and varactor regions Va to be formed with varactors. Although the MISFETs of the CMOS device include an NMISFET and a PMISFET, this figure shows only a region of the semiconductor device to be formed with an NMISFET.

The semiconductor substrate 10 is formed with a P well region 11 doped with a P-type impurity and an N well region 12 obtained by doping a part of the P well region 11 with an N-type impurity. The N well region 12 shown in FIG. 7 is an active region for a varactor. In each of the varactor region Va and the transistor region Tr, the semiconductor substrate 10 is provided with a gate dielectric 16 of a silicon oxide film, a polysilicon gate electrode 18 doped with an N-type impurity, an implantation offset spacer 17a of a silicon oxide film covering the sides of the polysilicon gate electrode 18, and a sidewall 17b of a silicon oxide film covering the surface of the implantation offset spacer 17a. The gate dielectric 16, the polysilicon gate electrode 18, the implantation offset spacer 17a, and the sidewall 17b in the varactor region Va are substantially equal to those in the transistor region Tr in material composition and dimension along the gate length direction, respectively. "Substantially equal" means that the formers are equal to the latters if variations that may inevitably be produced depending on lots of fabrication processes and sites on a wafer are ignored. More particularly, it means that both the regions are equal to each other in their design materials and dimensions.

A substrate contact impurity diffusion region 13e doped with an N-type impurity at a relatively high concentration is formed in a part of the N well region 12 located to one side of the polysilicon gate electrode 18 in the varactor region Va. However, no substrate contact impurity diffusion region is formed in a part of the N well region 12 located to the other side of the polysilicon gate electrode 18. This is a feature of the varactor of the semiconductor device according to this embodiment, which is different from that of the first embodiment. Furthermore, this embodiment is different from the third embodiment in that the substrate contact impurity diffusion region 13e is formed in a part of the N well region 12 apart from a part thereof located immediately below one side of the polysilicon gate electrode 18. Also in this embodiment, extension regions (or LDD regions) are not formed unlike the varactor of the known semiconductor device.

On the other hand, like the transistor of the known semiconductor device, there are formed, in parts of the P well region 11 located to both sides of the polysilicon gate electrode 18 in the transistor region Tr, high-concentration source/drain regions 14a doped with an N-type impurity at a relatively high concentration and extension regions 14b doped with an N-type impurity at an intermediate concentration. Each of the varactor region Va and the transistor region Tr is formed with an on-gate silicide layer 15a and on-diffusion-region silicide layers 15b through a salicide process.

The N-type impurity-doped substrate contact impurity diffusion region 13e in the varactor region Va is substantially equal in impurity concentration to the high-concentration source/drain regions 14a in the NMISFET of the transistor region Tr. Furthermore, as described above, the varactor region Va is provided with no impurity diffusion region substantially equal in impurity concentration to each extension region 14b of the NMISFET in the transistor region Tr. In this case, "substantially equal in impurity concentration" means that if variations that may inevitably be produced depending on lots of fabrication processes and sites on a wafer are ignored, the impurity diffusion region is equal in impurity concentration to the extension region 14b. More particularly, it means that ions are simultaneously implanted into the N well region 12 in the varactor region Va and the P well region 11 in the transistor region Tr, or the set ion implantation conditions in both the regions are the same.

FIGS. 8A through 8D are cross-sectional views illustrating process steps for fabricating the semiconductor device according to the fourth embodiment.

Figure 8A:
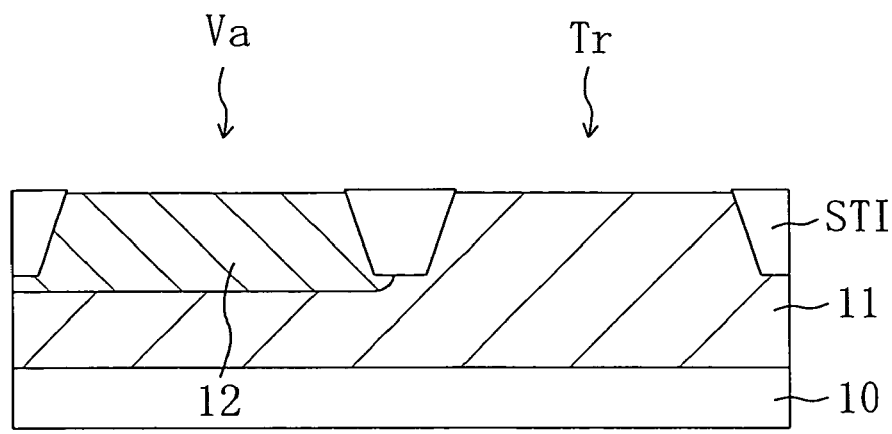
FIGS. 8A through 8D are cross-sectional views illustrating process steps for fabricating the semiconductor device according to the fourth embodiment.

First, in a process step shown in FIG. 8A, an N-type impurity such as phosphorus is implanted into a part of a P well region 11 that is a part of a semiconductor substrate 10 and is doped with a P-type impurity such as boron (B), thereby forming an N well region 12 for a varactor. The ion implantation conditions in this case are a dose of $1 \times 10^{13}$ cm$^{-2}$ and an acceleration voltage of 640 keV. Furthermore, the STI structure defines a transistor region Tr and a varactor region Va.

Figure 8B:
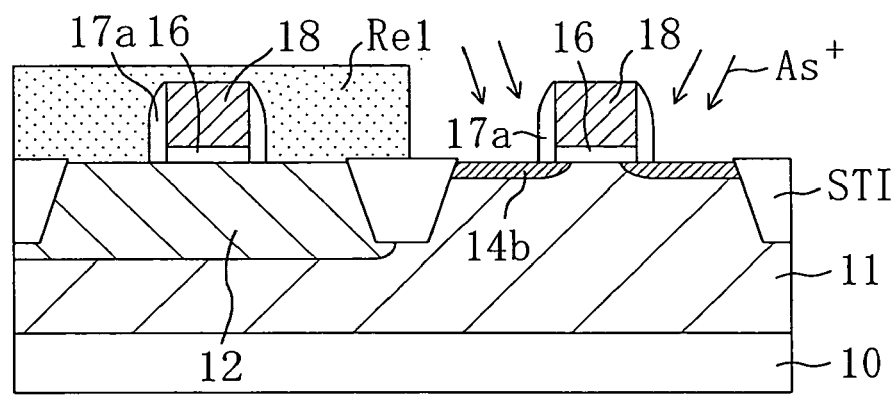

Next, in a process step shown in FIG. 8B, a silicon oxide film and a polysilicon film are deposited on the transistor region Tr and the varactor region Va to have thicknesses of approximately 2.8 nm and 180 nm, respectively. Then, an N-type impurity, such as phosphorus, is implanted into the polysilicon film, and thereafter the polysilicon film and the silicon oxide film are patterned, thereby forming a gate dielectric 16 and a polysilicon gate electrode 18. The gate length of the polysilicon gate electrode 18 is 0.15 μm, and the gate width thereof is 1 μm. Next, a silicon oxide film is deposited on the substrate to have a thickness of approximately 10 nm, and thereafter an implantation offset spacer 17a is formed by anisotropic etching to cover the sides of each polysilicon gate electrode 18. Then, a resist film Re1 is formed to cover the varactor region Va, and thereafter N-type impurity ions, such as arsenic ions (As$^+$), are implanted into the transistor region Tr to be formed with an NMISFET, using the resist film Re1 as an implantation mask. The ion implantation conditions in this case are a dose of 7×10$^{14}$ cm$^{-2}$, an acceleration voltage of 6 keV, and an angle of 0 degree at which the direction of implantation is tilted. In this manner, while in the transistor region Tr extension regions 14b are formed to self-align with the polysilicon gate electrode 18 and the implantation offset spacer 17a, no extension region is formed in the varactor region Va.

Figure 8C:
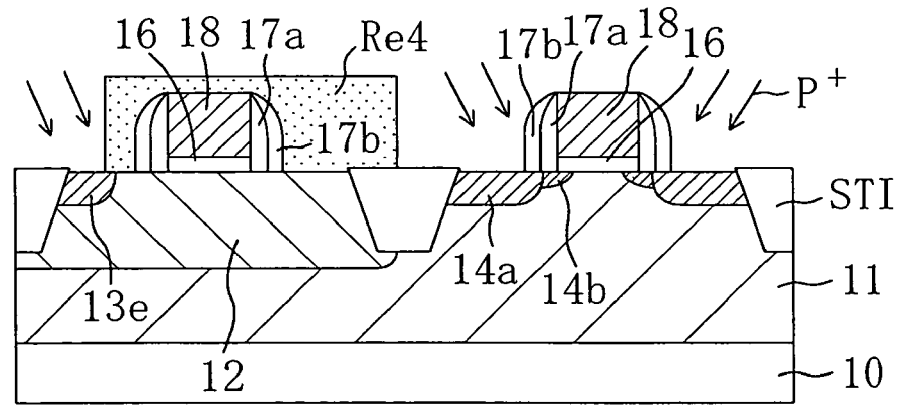

Next, in a process step shown in FIG. 8C, the resist film Re1 is removed. Then, a silicon oxide film is deposited on the substrate to have a thickness of approximately 75 nm, and thereafter anisotropic etching is performed to form sidewalls 17b to cover the surfaces of the implantation offset spacers 17a, respectively. Phosphorus ions (P$^+$) (or arsenic ions) are implanted as an N-type impurity into the varactor region Va and the NMISFET region of the transistor region Tr, using a resist film Re4 as a mask. The resist film Re4 covers the implantation offset spacer 17a, the sidewall 17b and the polysilicon gate electrode 18 in the varactor region Va and covers a part of the varactor region Va extending from a part of the N well region 12 located between one side of the polysilicon gate electrode 18 and a trench of the STI structure to a location on another trench. The ion implantation conditions are a dose of 6×10$^{15}$ cm$^{-2}$, an acceleration voltage of 50 keV, and an angle of 7 degrees at which the direction of implantation is tilted. In this manner, a substrate contact impurity diffusion region 13e is formed in a part of the N well region 12 apart from a part thereof located immediately below the other side of the polysilicon gate electrode 18 in the varactor region Va.

Figure 8D:
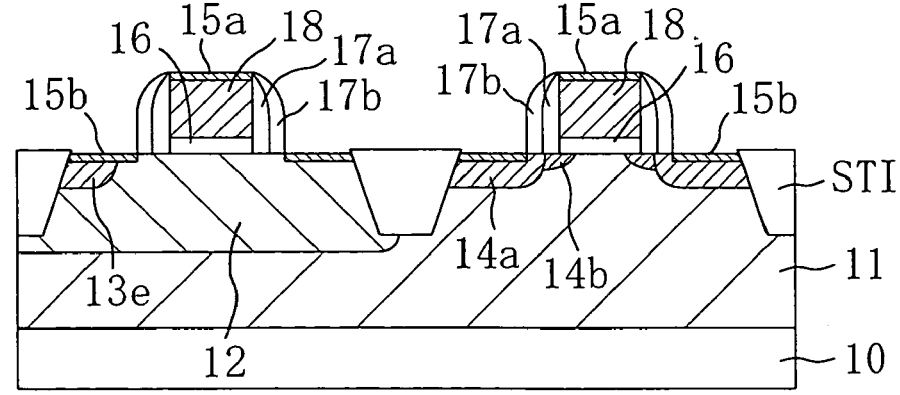

Next, in a process step shown in FIG. 8D, a generally known salicide process is carried out. This allows an on-gate silicide layer 15a (cobalt silicide layer) to be formed on the polysilicon gate electrode 18 in each of the varactor region Va and the transistor region Tr and also allows on-diffusion-region silicide layers 15b (cobalt silicide layers) to be formed on the N well region 12 and the substrate contact impurity diffusion region 13e in the varactor region Va and the high-concentration source/drain regions 14a in the transistor region Tr.

The semiconductor device of this embodiment can include a varactor that can keep a variable capacitance range wide while using the existing CMOS device fabricating process. More particularly, in the varactor of the semiconductor device of this embodiment, there exists no extension region, and the substrate contact impurity diffusion region 13e is formed by ion implantation using the resist mask Re4 as a mask. The resist mask Re4 covers the implantation offset spacer 17a, the sidewall 17b and the polysilicon gate electrode 18 and covers a part of the varactor region Va extending from a part of the N well region 12 located between one side of the polysilicon gate electrode 18 and a trench of the STI structure to a location on another trench of the STI structure. Therefore, a part of the varactor region Va located to the one side of the polysilicon gate electrode 18 constitutes only the N well region 12 containing an N-type impurity at an extremely low concentration. Thus, neither of an extension region and a substrate contact impurity diffusion region both for precluding the extension of a depletion layer exists in that part of the varactor region Va. Furthermore, no extension region exists also in a part of the varactor region Va located to the other side of the polysilicon gate electrode 18, while the substrate contact impurity diffusion region 13e is placed apart from a part of the N well region 12 located immediately below the polysilicon gate electrode 18. Since the extendable range of the depletion layer can therefore become wider than in the third embodiment, a wider capacitance variable range of the varactor can be attained for the polysilicon gate electrode 18 having a shortened gate length.

Although in this embodiment the implantation offset spacer 17a is provided to cover the sides of the polysilicon gate electrode 18, the implantation offset spacer 17a is not necessarily required. Even if the sidewall 17b directly covers the sides of the polysilicon gate electrode 18, the extendable range of the depletion layer can be kept as wide as possible, i.e., the basic effect of the present invention can be achieved. However, the provision of the implantation offset spacer 17a shortens the gate length to maintain a high driving force of the MISFET of the CMOS device, while it keeps the distance between the extension regions 14b long to suppress a short channel effect.

EMBODIMENT 5

FIGS. 9A through 9D are cross-sectional views illustrating process steps for fabricating a semiconductor device according to a fifth embodiment in which a varactor (MIS capacitor) is combined with a CMOS device. The semiconductor device of this embodiment includes an STI (Shallow Trench Isolation) structure partitioning the surface of a semiconductor substrate 10 that is a Si substrate into a plurality of active regions. The plurality of active regions comprise transistor regions Tr to be formed with MISFETs of the CMOS device and varactor regions Va to be formed with varactors. Although the MISFETs of the CMOS device include an NMISFET and a PMISFET, FIGS. 9A through 9D show only a region of the semiconductor device to be formed with an NMISFET.

First, in a process step shown in FIG. 9A, an N-type impurity such as phosphorus is implanted into a part of a P well region 11 that is a part of a semiconductor substrate 10 and is doped with a P-type impurity such as boron (B), thereby forming an N well region 12 for a varactor. The ion implantation conditions in this case are a dose of 1×10$^{13}$ cm$^{-2}$ and an acceleration voltage of 640 keV. Furthermore, the STI structure defines a transistor region Tr and a varactor region Va.

Next, in a process step shown in FIG. 9B, a silicon oxide film and a polysilicon film are deposited on the transistor region Tr and the varactor region Va to have thicknesses of approximately 2.8 nm and 180 nm, respectively. Then, an N-type impurity, such as phosphorus, is implanted into the polysilicon film, and thereafter the polysilicon film and the silicon oxide film are patterned, thereby forming a gate dielectric 16 and a polysilicon gate electrode 18. The gate length of the polysilicon gate electrode 18 is 0.15 μm, and the gate width thereof is 1 μm.

In this embodiment, unlike the first through fourth embodiments, the polysilicon gate electrode 18 in the varactor region Va is provided at one end of the N well region 12 (active region). More particularly, one side of the polysilicon gate electrode 18 in the varactor region Va is located adjacent to one end of a trench of the STI structure.

Next, a silicon oxide film is deposited on the substrate to have a thickness of approximately 10 nm, and thereafter an implantation offset spacer 17a is formed by anisotropic etching to cover the sides of each polysilicon gate electrode 18. At this time, in this embodiment, a part of the implantation offset spacer 17a covering one side of the polysilicon gate electrode 18 is partly provided on the trench of the STI structure. Alternatively, a part of the implantation offset spacer 17a covering one side of the polysilicon gate electrode 18 may be provided on the trench of the STI structure as a whole. Then, a resist film Re1 is formed to cover the varactor region Va, and thereafter N-type impurity ions, such as arsenic ions (As$^+$), are implanted into the transistor region Tr to be formed with an NMISFET, using the resist film Re1 as an implantation mask. The ion implantation conditions in this case are a dose of $7\times10^{14}$ cm$^{-2}$, an acceleration voltage of 6 keV, and an angle of 0 degree at which the direction of implantation is tilted. In this manner, while in the transistor region Tr extension regions 14b are formed to self-align with the polysilicon gate electrode 18 and the implantation offset spacer 17a, no extension region is formed in the varactor region Va.

Next, in a process step shown in FIG. 9C, the resist film Re1 is removed. Then, a silicon oxide film is deposited on the substrate to have a thickness of approximately 75 nm, and thereafter anisotropic etching is performed to form sidewalls 17b to cover the surfaces of the implantation offset spacers 17a, respectively. Phosphorus ions (P$^+$) (or arsenic ions) are implanted as an N-type impurity into the varactor region Va and the NMISFET region of the transistor region Tr, using the implantation offset spacer 17a, the sidewall 17b and the polysilicon gate electrode 18 as masks. The ion implantation conditions are a dose of $6\times10^{15}$ cm$^{-2}$, an acceleration voltage of 50 keV, and an angle of 7 degrees at which the direction of implantation is tilted. In this manner, a substrate contact impurity diffusion region 13f is formed in a part of the N well region 12 extending from the other side of the polysilicon gate electrode 18 in the varactor region Va to another trench of the STI structure.

Next, in a process step shown in FIG. 9D, a generally known salicide process is carried out. This allows an on-gate silicide layer 15a (cobalt silicide layer) to be formed on the polysilicon gate electrode 18 in each of the varactor region Va and the transistor region Tr and also allows on-diffusion-region silicide layers 15b (cobalt silicide layers) to be formed on the N well region 12 and the substrate contact impurity diffusion region 13f in the varactor region Va and the high-concentration source/drain regions 14a in the transistor region Tr.

In the semiconductor device of this embodiment, as shown in FIG. 9D, the semiconductor substrate 10 is formed with a P well region 11 doped with a P-type impurity and an N well region 12 obtained by doping a part of the P well region 11 with an N-type impurity. The N well region 12 shown in FIG. 9D is an active region for a varactor. In each of the varactor region Va and the transistor region Tr, the semiconductor substrate 10 is provided with a gate dielectric 16 of a silicon oxide film, a polysilicon gate electrode 18 doped with an N-type impurity, an implantation offset spacer 17a of a silicon oxide film covering the sides of the polysilicon gate electrode 18, and a sidewall 17b of a silicon oxide film covering the surface of the implantation offset spacer 17a. The gate dielectric 16, the polysilicon gate electrode 18, the implantation offset spacer 17a, and the sidewall 17b in the varactor region Va are substantially equal to those in the transistor region Tr in material composition and dimension along the gate length direction, respectively. "Substantially equal" means that the formers are equal to the latters if variations that may inevitably be produced depending on lots of fabrication processes and sites on a wafer are ignored. More particularly, it means that both the regions are equal to each other in their design materials and dimensions.

In the varactor region Va, one side of the polysilicon gate electrode 18 is adjacent to a trench of the STI structure. In this case, the implantation offset spacer 17a is placed across the boundary between the trench of the STI structure and the N well region 12. Thus, the substrate contact impurity diffusion region 13f is formed only in a part of the N well region 12 located to the other side of the polysilicon gate electrode 18 to include an N-type impurity at a relatively high concentration. Unlike the first through fourth embodiments, as described above, the polysilicon gate electrode 18 in the varactor region Va is placed not on the middle of the active region but on one end thereof. This is a feature of the varactor of the semiconductor device according to this embodiment. Also in this embodiment, extension regions (or LDD regions) are not formed unlike the varactor of the known semiconductor device.

On the other hand, like the transistor of the known semiconductor device, there are formed, in parts of the P well region 11 located to both sides of the polysilicon gate electrode 18 in the transistor region Tr, high-concentration source/drain regions 14a doped with an N-type impurity at a relatively high concentration and extension regions 14b doped with an N-type impurity at an intermediate concentration. Each of the varactor region Va and the transistor region Tr is formed with an on-gate silicide layer 15a and on-diffusion-region silicide layers 15b through a salicide process.

The N-type impurity-doped substrate contact impurity diffusion region 13f in the varactor region Va is substantially equal in impurity concentration to the high-concentration source/drain regions 14a in the NMISFET of the transistor region Tr. Furthermore, as described above, the varactor region Va is provided with no impurity diffusion region substantially equal in impurity concentration to each extension region 14b of the NMISFET in the transistor region Tr. In this case, "substantially equal in impurity concentration" means that if variations that may inevitably be produced depending on lots of fabrication processes and sites on a wafer are ignored, the impurity diffusion region is equal in impurity concentration to each extension region 14b. More particularly, it means that ions are simultaneously implanted into the N well region 12 in the varactor region Va and the P well region 11 in the transistor region Tr, or the set ion implantation conditions in both the regions are the same.

The semiconductor device of this embodiment can include a varactor that can keep a variable capacitance range wide while using the existing CMOS device fabricating process. More particularly, in the varactor of the semiconductor device of this embodiment, there exists no extension region, and a part of the varactor region Va located to one side of the polysilicon gate electrode 18 constitutes only the STI structure. Thus, neither of an extension region and a substrate contact impurity diffusion region both for precluding the extension of a depletion layer exists in that part of the varactor region Va. Furthermore, no extension region exists also in a part of the varactor region Va located to the other side of the polysilicon gate electrode 18. Since the extendable range of the depletion layer can therefore become wider than that of the varactor in the known semiconductor device, the variable capacitance range of the varactor can be kept wide even for the polysilicon gate electrode 18 having a shortened gate length.

Although in this embodiment the implantation offset spacer 17a is provided to cover the sides of the polysilicon gate electrode 18, the implantation offset spacer 17a is not necessarily required. Even if the sidewall 17b directly covers the sides of the polysilicon gate electrode 18, the extendable range of the depletion layer can be kept as wide as possible, i.e., the basic effect of the present invention can be achieved. However, the provision of the implantation offset spacer 17a shortens the gate length to maintain a high driving force of the MISFET of the CMOS device, while it keeps the distance between the extension regions 14b long to suppress a short channel effect. Simultaneously, because the distance between the substrate contact impurity diffusion region 13f and a trench of the STI structure in the varactor is longer, a wider variable capacitance range of the varactor can be attained.

EMBODIMENT 6

FIGS. 10A through 10D are cross-sectional views illustrating process steps for fabricating a semiconductor device according to a sixth embodiment in which a varactor (MIS capacitor) is combined with a CMOS device. The semiconductor device of this embodiment includes an STI (Shallow Trench Isolation) structure partitioning the surface of a semiconductor substrate 10 that is a Si substrate into a plurality of active regions. The plurality of active regions comprise transistor regions Tr to be formed with MISFETs of the CMOS device and varactor regions Va to be formed with varactors. Although the MISFETs of the CMOS device include an NMISFET and a PMISFET, FIGS. 10A through 10D show only a region of the semiconductor device to be formed with an NMISFET.

First, in a process step shown in FIG. 10A, an N-type impurity such as phosphorus is implanted into a part of a P well region 11 that is a part of a semiconductor substrate 10 and is doped with a P-type impurity such as boron (B), thereby forming an N well region 12 for a varactor. The ion implantation conditions in this case are a dose of $1\times10^{13}$ cm$^{-2}$ and an acceleration voltage of 640 keV. Furthermore, the STI structure defines a transistor region Tr and a varactor region Va.

Next, in a process step shown in FIG. 10B, a silicon oxide film and a polysilicon film are deposited on the transistor region Tr and the varactor region Va to have thicknesses of approximately 2.8 nm and 180 nm, respectively. Then, an N-type impurity, such as phosphorus, is implanted into the polysilicon film, and thereafter the polysilicon film and the silicon oxide film are patterned, thereby forming a gate dielectric 16 and a polysilicon gate electrode 18. The gate length of the polysilicon gate electrode 18 is 0.15 μm, and the gate width thereof is 1 μm.

In this embodiment, unlike the first through fourth embodiments, the polysilicon gate electrode 18 in the varactor region Va is placed above one end of the N well region 12 (active region). More particularly, one side of the polysilicon gate electrode 18 in the varactor region Va is located adjacent to one end of a trench of the STI structure.

Next, a silicon oxide film is deposited on the substrate to have a thickness of approximately 10 nm, and thereafter an implantation offset spacer 17a is formed by anisotropic etching to cover the sides of each polysilicon gate electrode 18. At this time, in this embodiment, a part of the implantation offset spacer 17a covering one side of the polysilicon gate electrode 18 is partly provided on the trench of the STI structure. Alternatively, a part of the implantation offset spacer 17a covering one side of the polysilicon gate electrode 18 may be provided on the trench of the STI structure as a whole. Then, a resist film Re1 is formed to cover the varactor region Va, and thereafter N-type impurity ions, such as arsenic ions (As$^+$), are implanted into the transistor region Tr to be formed with an NMISFET, using the resist film Re1 as an implantation mask. The ion implantation conditions in this case are a dose of $7\times10^{14}$ cm$^{-2}$, an acceleration voltage of 6 keV, and an angle of 0 degree at which the direction of implantation is tilted. In this manner, while in the transistor region Tr extension regions 14b are formed to self-align with the polysilicon gate electrode 18 and the implantation offset spacer 17a, no extension region is formed in the varactor region Va.

Next, in a process step shown in FIG. 10C, the resist film Re1 is removed. Then, a silicon oxide film is deposited on the substrate to have a thickness of approximately 75 nm, and thereafter anisotropic etching is performed to form sidewalls 17b to cover the surfaces of the implantation offset spacers 17a, respectively. Phosphorus ions (P$^+$) (or arsenic ions) are implanted as an N-type impurity into the varactor region Va and the NMISFET region of the transistor region Tr, using a resist film Re5 as a mask. The resist film Re5 covers the polysilicon gate electrode 18, the implantation offset spacer 17a and the sidewall 17b in the varactor region Va. The ion implantation conditions in this case are a dose of $6\times10^{15}$ cm$^{-2}$, an acceleration voltage of 50 keV, and an angle of 7 degrees at which the direction of implantation is tilted. In this manner, a substrate contact impurity diffusion region 13g is formed in a part of the N well region 12 apart from a part thereof located immediately below the other side of the polysilicon gate electrode 18 in the varactor region Va.

Next, in a process step shown in FIG. 10D, a generally known salicide process is carried out. This allows an on-gate silicide layer 15a (cobalt silicide layer) to be formed on the polysilicon gate electrode 18 in each of the varactor region Va and the transistor region Tr and also allows on-diffusion-region silicide layers 15b (cobalt silicide layers) to be formed on each of the N well region 12 and the substrate contact impurity diffusion region 13g in the varactor region Va and the high-concentration source/drain regions 14a in the transistor region Tr.

In the semiconductor device of this embodiment, as shown in FIG. 10D, the semiconductor substrate 10 is formed with a P well region 11 doped with a P-type impurity and an N well region 12 obtained by doping a part of the P well region 11 with an N-type impurity. The N well region 12 shown in FIG. 10D is an active region for a varactor. In each of the varactor region Va and the transistor region Tr, the semiconductor substrate 10 is provided with a gate dielectric 16 of a silicon oxide film, a polysilicon gate electrode 18 doped with an N-type impurity, an implantation offset spacer 17a of a silicon oxide film covering the sides of the polysilicon gate electrode 18, and a sidewall 17b of a silicon oxide film covering the surface of the implantation offset spacer 17a. The gate dielectric 16, the polysilicon gate electrode 18, the implantation offset spacer 17a, and the sidewall 17b in the varactor region Va are substantially equal to those in the transistor region Tr in material composition and dimension along the gate length direction, respectively. "Substantially equal" means that the formers are equal to the latters if variations that may inevitably be produced depending on lots of fabrication processes and sites on a wafer are ignored. More particularly, it means that both the regions are equal to each other in their design materials and dimensions.

In the varactor region Va, one side of the polysilicon gate electrode 18 is adjacent to a trench of the STI structure. In this case, the implantation offset spacer 17a is placed across the boundary between the trench of the STI structure and the N well region 12. Thus, a substrate contact impurity diffusion region 13g is formed only in a part of the N well region 12 apart from a part thereof located immediately below the other side of the polysilicon gate electrode 18 to contain an N-type impurity at a relatively high concentration. Unlike the first through fourth embodiments, as described above, the polysilicon gate electrode 18 in the varactor region Va is placed not on the middle of the active region but on one end thereof. This is a feature of the varactor of the semiconductor device according to this embodiment. Furthermore, unlike the fifth embodiment, the substrate contact impurity diffusion region 13g is provided in a part of the N well region 12 located below the other side of the polysilicon gate electrode 18 in the varactor region Va. Also in this embodiment, extension regions (or LDD regions) are not formed unlike the varactor of the known semiconductor device.

On the other hand, like the transistor of the known semiconductor device, there are formed, in parts of the P well region 11 located to both sides of the polysilicon gate electrode 18 in the transistor region Tr, high-concentration source/drain regions 14a doped with an N-type impurity at a relatively high concentration and extension regions 14b doped with an N-type impurity at an intermediate concentration. Each of the varactor region Va and the transistor region Tr is formed with an on-gate silicide layer 15a and on-diffusion-region silicide layers 15b through a salicide process.

The N-type impurity-doped substrate contact impurity diffusion region 13g in the varactor region Va is substantially equal in impurity concentration to the high-concentration source/drain regions 14a in the NMISFET of the transistor region Tr. Furthermore, as described above, the varactor region Va is provided with no impurity diffusion region substantially equal in impurity concentration to each extension region 14b of the NMISFET in the transistor region Tr. In this case, "substantially equal in impurity concentration" means that if variations that may inevitably be produced depending on lots of fabrication processes and sites on a wafer are ignored, the impurity diffusion region is equal in impurity concentration to each extension region 14b. More particularly, it means that ions are simultaneously implanted into the N well region 12 in the varactor region Va and the P well region 11 in the transistor region Tr, or the set ion implantation conditions in both the regions are the same.

The semiconductor device of this embodiment can include a varactor that can keep a variable capacitance range wide while using the existing CMOS device fabricating process. More particularly, in the varactor of the semiconductor device of this embodiment, there exists no extension region, and a part of the varactor region Va located to one side of the polysilicon gate electrode 18 constitutes only the STI structure. Thus, neither of an extension region and a substrate contact impurity diffusion region both for precluding the extension of a depletion layer exists in that part of the varactor region Va. Furthermore, no extension region exists also in a part of the varactor region Va located to the other side of the polysilicon gate electrode 18. Furthermore, the substrate contact impurity diffusion region 13g is provided in a part of the N well region 12 apart from a part thereof located below the other side of the polysilicon gate electrode 18 in the varactor region Va. Since the extendable range of the depletion layer can therefore become wider than that of the varactor in the semiconductor device of the fifth embodiment, a wider variable capacitance range of the varactor can be attained even for the polysilicon gate electrode 18 having a shortened gate length.

Although in this embodiment the implantation offset spacer 17a is provided to cover the sides of the polysilicon gate electrode 18, the implantation offset spacer 17a is not necessarily required. Even if the sidewall 17b directly covers the sides of the polysilicon gate electrode 18, the extendable range of the depletion layer can be kept as wide as possible, i.e., the basic effect of the present invention can be achieved. However, the provision of the implantation offset spacer 17a shortens the gate length to maintain a high driving force of the MISFET of the CMOS device, while it keeps the distance between the extension regions 14b long to suppress a short channel effect.

EMBODIMENT 7

FIGS. 11A through 11D are cross-sectional views illustrating process steps for fabricating a semiconductor device according to a seventh embodiment in which a varactor (MIS capacitor) is combined with a CMOS device. The semiconductor device of this embodiment includes an STI (Shallow Trench Isolation) structure partitioning the surface of a semiconductor substrate 10 that is a Si substrate into a plurality of active regions. The plurality of active regions comprise transistor regions Tr to be formed with MISFETs of the CMOS device and varactor regions Va to be formed with varactors. Although the MISFETs of the CMOS device include an NMISFET and a PMISFET, FIGS. 11A through 11D show only a region of the semiconductor device to be formed with an NMISFET.

First, in a process step shown in FIG. 11A, an N-type impurity such as phosphorus are implanted into a part of a P well region 11 that is a part of a semiconductor substrate 10 and is doped with a P-type impurity such as boron (B), thereby forming an N well region 12 for a varactor. The ion implantation conditions in this case are a dose of $1\times10^{13}$ cm$^{-2}$ and an acceleration voltage of 640 keV. Furthermore, the STI structure defines a transistor region Tr and a varactor region Va.

Next, in a process step shown in FIG. 11B, a silicon oxide film and a polysilicon film are deposited on the transistor region Tr and the varactor region Va to have thicknesses of approximately 2.8 nm and 180 nm, respectively. Then, an N-type impurity, such as phosphorus, is implanted into the polysilicon film, and thereafter the polysilicon film and the silicon oxide film are patterned, thereby forming a gate dielectric 16 and a polysilicon gate electrode 18. The gate length of the polysilicon gate electrode 18 is 0.15 μm, and the gate width thereof is 1 μm.

Next, a silicon oxide film is deposited on the substrate to have a thickness of approximately 10 nm, and thereafter an implantation offset spacer 17a is formed by anisotropic etching to cover the sides of each polysilicon gate electrode 18. Then, a resist film Re1 is formed to cover the varactor region Va, and thereafter N-type impurity ions, such as arsenic ions (As$^+$), are implanted into the transistor region Tr to be formed with an NMISFET, using the resist film Re1 as an implantation mask. The ion implantation conditions in this case are a dose of $7\times10^{14}$ cm$^{-2}$, an acceleration voltage of 6 keV, and an angle of 0 degree at which the direction of implantation is tilted. In this manner, while in the transistor region Tr extension regions 14b are formed to self-align with the polysilicon gate electrode 18 and the implantation offset spacer 17a, no extension region is formed in the varactor region Va.

Next, in a process step shown in FIG. 11C, the resist film Re1 is removed. Then, a silicon oxide film is deposited on the substrate to have a thickness of approximately 75 nm, and thereafter anisotropic etching is performed to form sidewalls 17b to cover the surfaces of the implantation offset spacers 17a, respectively. Phosphorus ions (P$^+$) (or arsenic ions) are implanted as an N-type impurity into the varactor region Va and the NMISFET region of the transistor region Tr, using a resist film Re6 covering the whole polysilicon gate electrode 18 as a mask. The ion implantation conditions are a dose of $6\times10^{15}$ cm$^{-2}$, an acceleration voltage of 50 keV, and an angle of 7 degrees at which the direction of implantation is tilted. In this manner, the varactor region Va is formed with no substrate contact impurity diffusion region. This is different from the first through sixth embodiments.

Next, in a process step shown in FIG. 11D, a generally known salicide process is carried out. This allows an on-gate silicide layer 15a (cobalt silicide layer) to be formed on the polysilicon gate electrode 18 in each of the varactor region Va and the transistor region Tr and also allows on-diffusion-region silicide layers 15b (cobalt silicide layers) to be formed on the N well region 12 in the varactor region Va and the high-concentration source/drain regions 14a in the transistor region Tr.

In the semiconductor device of this embodiment, as shown in FIG. 11D, the semiconductor substrate 10 is formed with a P well region 11 doped with a P-type impurity and an N well region 12 obtained by doping a part of the P well region 11 with an N-type impurity. The N well region 12 shown in FIG. 11D is an active region for a varactor. In each of the varactor region Va and the transistor region Tr, the semiconductor substrate 10 is provided with a gate dielectric 16 of a silicon oxide film, a polysilicon gate electrode 18 doped with an N-type impurity, an implantation offset spacer 17a of a silicon oxide film covering the sides of the polysilicon gate electrode 18, and a sidewall 17b of a silicon oxide film covering the surface of the implantation offset spacer 17a. The gate dielectric 16, the polysilicon gate electrode 18, the implantation offset spacer 17a, and the sidewall 17b in the varactor region Va are substantially equal to those in the transistor region Tr in material composition and dimension along the gate length direction, respectively. "Substantially equal" means that the formers are equal to the latters if variations that may inevitably be produced depending on lots of fabrication processes and sites on a wafer are ignored. More particularly, it means that both the regions are equal to each other in their design materials and dimensions.

Unlike the first through sixth embodiments, in the varactor region Va, no substrate contact impurity diffusion region is provided and thus each on-diffusion-layer silicide layer 15b serves as a substrate contact region. This is a feature of the semiconductor device according to this embodiment. Also in this embodiment, extension regions (or LDD regions) are not formed unlike the varactor of the known semiconductor device.

On the other hand, like the transistor of the known semiconductor device, there are formed, in parts of the P well region 11 located to both sides of the polysilicon gate electrode 18 in the transistor region Tr, high-concentration source/drain regions 14a doped with an N-type impurity at a relatively high concentration and extension regions 14b doped with an N-type impurity at an intermediate concentration. Each of the varactor region Va and the transistor region Tr is formed with an on-gate silicide layer 15a and on-diffusion-region silicide layers 15b through a salicide process.

As described above, the varactor region Va is provided with neither impurity diffusion region having an impurity concentration substantially equal to that of the extension region 14b of the NMISFET in the transistor region Tr nor impurity diffusion region having an impurity concentration substantially equal to that of each high-concentration impurity diffusion regions 14a of the NMISFET in the transistor region Tr. In this case, "substantially equal in impurity concentration" means that if variations that may inevitably be produced depending on lots of fabrication processes and sites on a wafer are ignored, the impurity diffusion region is equal in impurity concentration to the extension region 14b. More particularly, it means that ions are simultaneously implanted into the N well region 12 in the varactor region Va and the P well region 11 in the transistor region Tr, or the set ion implantation conditions in both the regions are the same.

The semiconductor device of this embodiment can include a varactor that can keep a variable capacitance range wide while using the existing CMOS device fabricating process. More particularly, in the varactor of the semiconductor device of this embodiment, there exists neither of an extension region and a substrate contact impurity diffusion region both containing an impurity at a higher concentration than that of an impurity with which the substrate is doped by ion implantation for the formation of the N well region 12. Thus, neither of an extension region and a substrate contact impurity diffusion region both for precluding the extension of a depletion layer exists therein. Since the extendable range of the depletion layer can therefore become wider than that of the varactor in each semiconductor device of the first through sixth embodiments, a wider variable capacitance range of the varactor can be attained even for the polysilicon gate electrode 18 having a shortened gate length.

Although in this embodiment the implantation offset spacer 17a is provided to cover the sides of the polysilicon gate electrode 18, the implantation offset spacer 17a is not necessarily required. Even if the sidewall 17b directly covers the sides of the polysilicon gate electrode 18, the extendable range of the depletion layer can be kept as wide as possible, i.e., the basic effect of the present invention can be achieved. However, the provision of the implantation offset spacer 17a shortens the gate length to maintain a high driving force of the MISFET of the CMOS device, while it keeps the distance between the extension regions 14b long to suppress a short channel effect.

VARIANTS OF EMBODIMENTS

In the fifth embodiment, the implantation offset spacer is placed across the boundary between the active region (second active region) and a trench of the STI structure (isolation). If the implantation offset spacer is not provided, the sidewall may be provided across the boundary between the active region and the trench of the STI structure.

In the sixth embodiment, the implantation offset spacer is placed across the boundary between the active region (second active region) and a trench of the STI structure (isolation). Alternatively, in the process step shown in FIG. 10C, the resist film Re5 may be placed across the boundary between the active region and the trench of the STI structure.

(Relationship between Effects of the Invention and the Location of Impurity Diffusion Region)

Figure 12A:
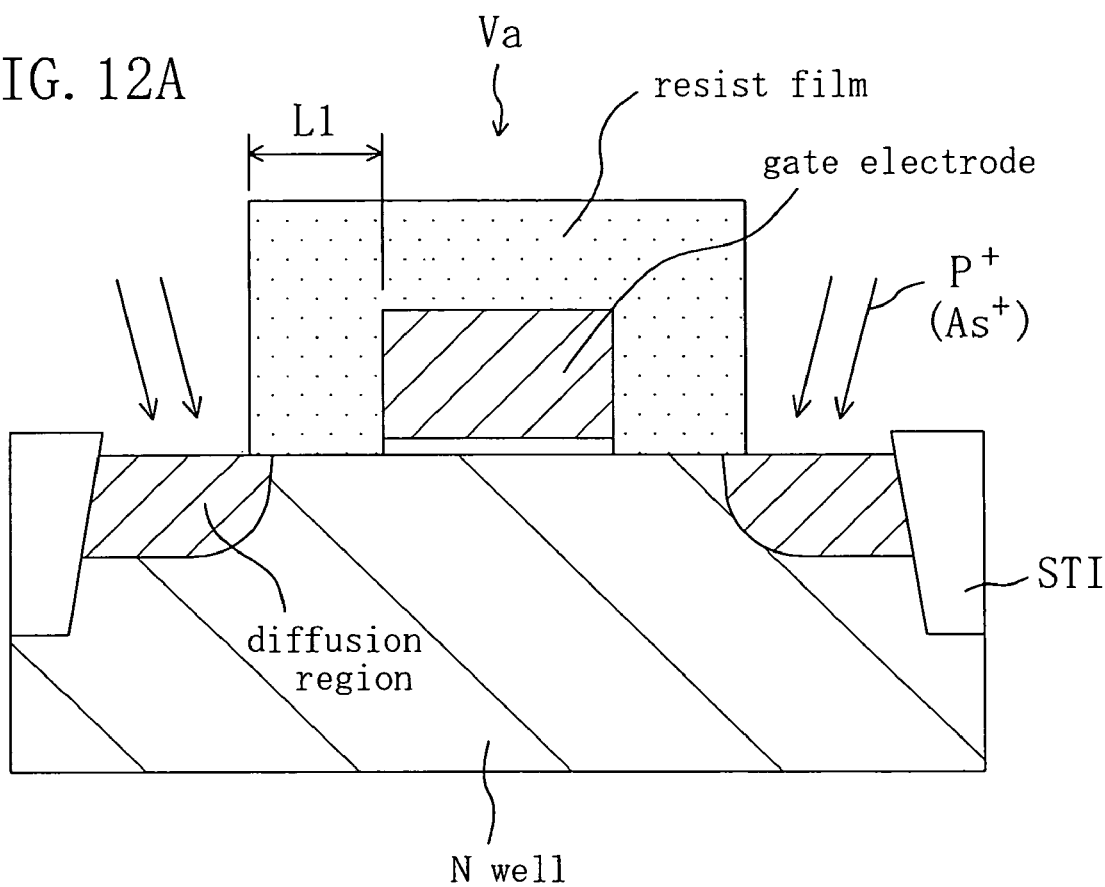
FIGS. 12A and 12B are a cross-sectional view illustrating a model of a simulation performed to verify effects of the present invention and a graph showing the results of the simulation, respectively.
Figure 12B:
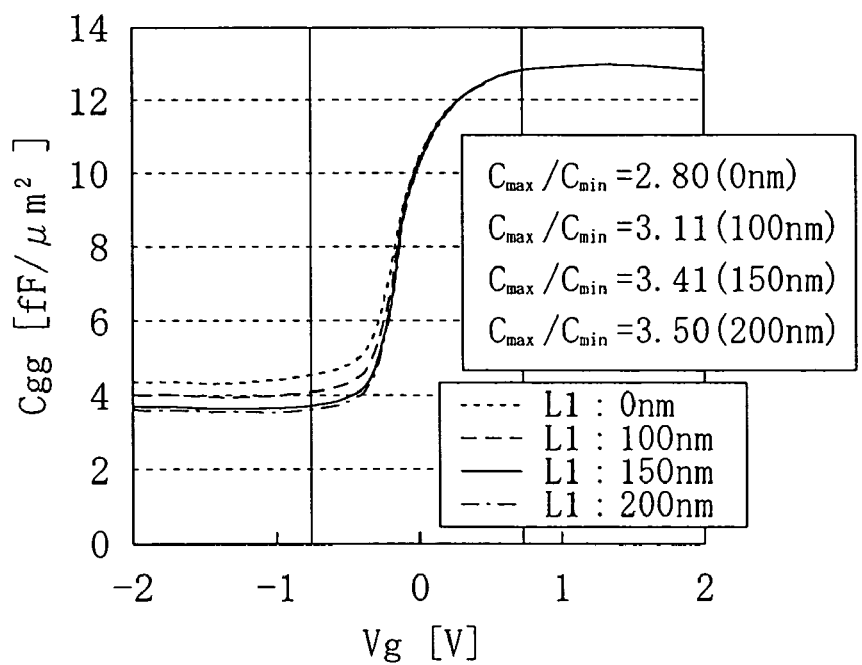
Figure 13:
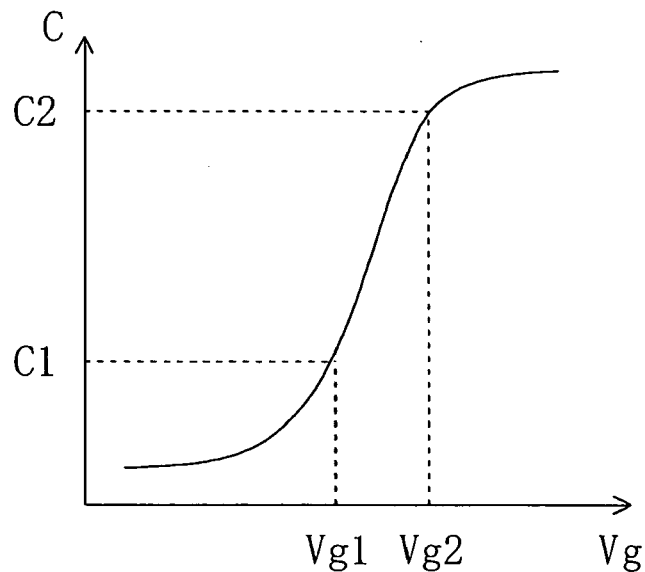
FIG. 13 is a graph showing the bias dependence of the capacitance of a PN diode.
Figure 14:
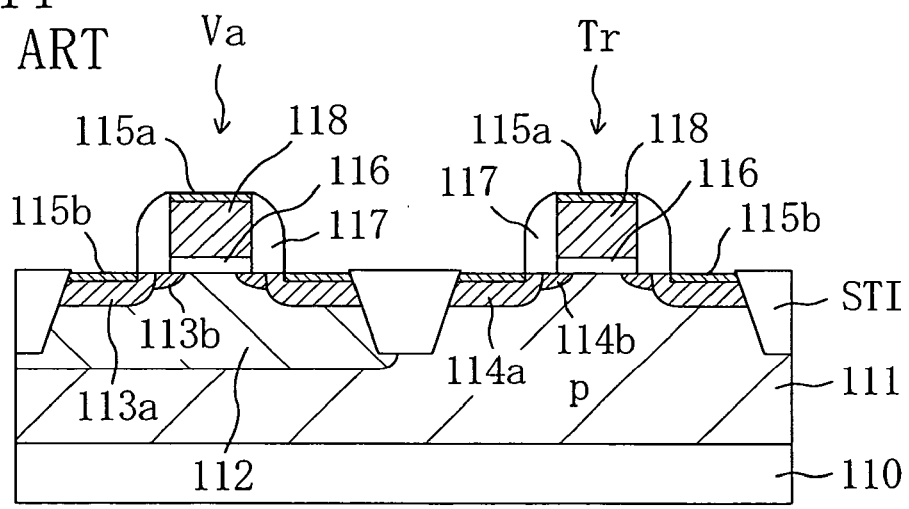
FIG. 14 is a cross-sectional view showing the structure of a known semiconductor device in which a CMOS device is combined with a varactor (MIS capacitor) on a common substrate.
Figure 15:
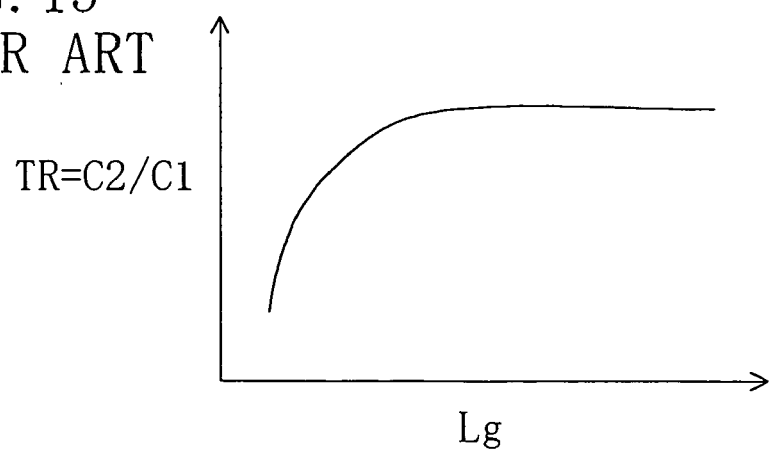
FIG. 15 is a graph showing the gate-length dependence of the tuning ratio of a varactor in a semiconductor device formed through a known fabricating process.

FIGS. 12A and 12B are a cross-sectional view illustrating a model of a simulation performed to verify effects of the present invention and a graph showing the results of the simulation, respectively.

In FIG. 12A, L1 designates the distance between one side of a gate electrode and one side of a resist film serving as an implantation mask when high-concentration impurity diffusion regions are to be formed which are substrate contact impurity diffusion regions in the varactor region Va. In this model structure, the impurity diffusion regions are constituted by only high-concentration source/drain regions. However, L1=0 corresponds to the case where extension regions and high-concentration impurity diffusion regions are formed as in the varactor of the known semiconductor device. L1=100 nm corresponds to the case where a sidewall (or an implantation offset spacer and a sidewall) is provided to have a lateral thickness of 100 nm at its lower end and no extension region is formed.

The axis of abscissas in FIG. 12B represents gate bias Vg (V), while the axis of ordinates represents gate-to-substrate capacitance Cgg (fF/μm$^2$). More particularly, the ratio Cmax/Cmin between the maximum value Cmax and the minimum value Cmin of the gate-to-substrate capacitance (MIS capacitance) represents the width of the variable capacitance range. As shown in FIG. 12B, the variable capacitance range extends with the increase of L1. Therefore, in order to achieve effects of the present invention, in the structure of the semiconductor device shown in FIG. 1, the following is preferable. The varactor region Va is provided with not extension regions but an implantation offset spacer 17a and a sidewall 17b that have a total lateral thickness of 100 nm at their lower end (or a sidewall alone of a lateral thickness of 100 nm). This means that the distance between one side of the polysilicon gate 18 and one end of each substrate contact impurity diffusion region 13a is longer than 0 nm. That is, the polysilicon gate electrode 18 and the substrate contact impurity diffusion region 13a do not overlap each other in a plan view.

As shown in FIG. 12B, when L1 reaches 150 nm or more, the variable capacitance range does not extend much in spite of the increase of L1. Hence, in the process step shown in FIG. 4C of the second embodiment, it is more preferable that the distance between the one side of the resist film Re2 and the one side of the polysilicon gate electrode 18 is 150 nm or more. This means that the distance between the one side of the polysilicon gate electrode 18 and the one end of each substrate contact impurity diffusion region 13c is more preferably 50 nm or more.

The semiconductor devices comprising the varactors of the present invention can be utilized for radio frequency circuits, such as voltage-controlled oscillators, requiring voltage-variable capacitors (varactors).

What is claimed is:

1. A semiconductor device comprising a MISFET including a first gate electrode formed on a first active region which is a first impurity diffusion region of a first conductivity type and surrounded by isolation trenches and a MIS capacitor including a second gate electrode formed on a second active region which is a second impurity diffusion region of a second conductivity type and surrounded by the isolation trenches, wherein the MISFET comprises:
a first gate dielectric interposed between the first gate electrode and the first active region;
a first sidewall covering the sides of the first gate electrode;
a first offset spacer interposed between the first gate electrode and the first sidewall;
source and drain regions of a second conductivity type formed in parts of the first active region located to both sides of the first gate electrode;
a third impurity diffusion region of a second conductivity type interposed between each of the source and drain regions and a part of the first active region located immediately below the first gate electrode, and containing an impurity at a lower concentration than the source and drain regions;
a first silicide layer formed in an upper portion of the first gate electrode; and
a second silicide layer formed in each upper portion of the source and drain regions, the MIS capacitor comprises:
a second gate dielectric interposed between the second gate electrode and the second active region;
a second sidewall covering the sides of the second gate electrode;
a second offset spacer interposed between the second gate electrode and the second sidewall;
at least one substrate contact region of a second conductivity type provided in a part of the second active region located to at least one side of the second gate electrode;
a third silicide layer formed in an upper portion of the second gate electrode; and
a fourth suicide layer formed in an upper portion of the substrate contact region,
the second sidewall is formed so as to be in contact with on the second active region,
said at least one substrate contact region is in contact with the isolation trench located along the gate length,
the second active region has no impurity diffusion region substantially equal in impurity concentration to the third impurity diffusion region, and
said at least one substrate contact region overlaps with the second offset spacer in a plan view.

2. The semiconductor device of claim 1, wherein said at least one substrate contact region is substantially equal in impurity concentration to the source and drain regions of the MISFET.

3. The semiconductor device of claim 1, wherein
said at least one substrate contact region does not overlap with the second gate electrode in a plan view.

4. The semiconductor device of claim 1, wherein
said at least one substrate contact region of the MIS capacitor is formed in the second active region only between one side of the second gate electrode and one said isolation trench.

5. The semiconductor device of claim 1, wherein
a part of the second sidewall covering the other side of the second gate electrode in the MIS capacitor is at least partly provided on one said isolation trench, and
said at least one substrate contact region in the MIS capacitor is formed in the second active region only between the other side of the second gate electrode and another said isolation trench.

6. The semiconductor device of claim 1, wherein
a part of the second offset spacer covering the other side of the second gate electrode in the MIS capacitor is provided on one said isolation trench, and
said at least one substrate contact region of the MIS capacitor is formed in the second active region only between the other side of the second gate electrode and another said isolation trench.

7. The semiconductor device of claim 1, wherein
the second gate electrode is substantially equal in dimension along the gate length to the first gate electrode.

8. The semiconductor device of claim 1, wherein
no impurity diffusion region substantially equal in impurity concentration to the third impurity diffusion region is formed between the substrate contact region and a part of the second active region located immediately below the second gate electrode.

9. The semiconductor device of claim 1, wherein
the third impurity diffusion region overlaps with the first gate electrode and the first offset spacer in a plan view.

10. The semiconductor device of claim 1, wherein the second offset spacer and the second sidewall are made of a silicon oxide film.

11. The semiconductor device of claim 1, wherein the first conductivity type is P-type, and the second conductivity type is N-type.

12. The semiconductor device of claim 1, wherein the first gate electrode and the second gate electrode are made of a polysilicon film.

13. The semiconductor device of claim 1, wherein the isolation trench comprises Shallow Trench Isolation.

14. The semiconductor device of claim 1, wherein said at least one substrate contact region is formed in a part of the second active region located to both sides of the second gate electrode.

15. A semiconductor device comprising a MISFET including a first gate electrode formed on a first active region which is a first impurity diffusion region of a first conductivity type and surrounded by isolation trenches and a MIS capacitor including a second gate electrode formed on a second active region which is a second impurity diffusion region of a second conductivity type and surrounded by the isolation trenches, wherein the MISFET comprises:
a first gate dielectric interposed between the first gate electrode and the first active region;
a first sidewall covering the sides of the first gate electrode;
a first offset spacer interposed between the first gate electrode and the first sidewall;
source and drain regions of a second conductivity type formed in parts of the first active region located to both sides of the first gate electrode;
a third impurity diffusion region of a second conductivity type interposed between each of the source and drain regions and a part of the first active region located immediately below the first gate electrode, and containing an impurity at a lower concentration than the source and drain regions;
a first silicide layer formed in an upper portion of the first gate electrode; and
a second silicide layer formed in each upper portion of the source and drain regions, the MIS capacitor comprises:
a second gate dielectric interposed between the second gate electrode and the second active region;
a second sidewall covering the sides of the second gate electrode;
a second offset spacer interposed between the second gate electrode and the second sidewall;
at least one substrate contact region of a second conductivity type provided in a part of the second active region located to at least one side of the second gate electrode;
a third silicide layer formed in an upper portion of the second gate electrode; and
a fourth silicide layer formed in an upper portion of the substrate contact region,
the second sidewall is formed so as to be in contact with on the second active region,
said at least one substrate contact region is in contact with the isolation trench located along the gate length,
the second active region has no impurity diffusion region substantially equal in impurity concentration to the third impurity diffusion region, and
the second offset spacer and the second sidewall are made of a silicon oxide film.

16. The semiconductor device of claim 15, wherein said at least one substrate contact region is substantially equal in impurity concentration to the source and drain regions of the MISFET.

17. The semiconductor device of claim 15, wherein said at least one substrate contact region does not overlap with the second gate electrode in a plan view.

18. The semiconductor device of claim 15, wherein said at least one substrate contact region of the MIS capacitor is formed in the second active region only between one side of the second gate electrode and one said isolation trench.

19. The semiconductor device of claim 15, wherein a part of the second sidewall covering the other side of the second gate electrode in the MIS capacitor is at least partly provided on one said isolation trench, and said at least one substrate contact region in the MIS capacitor is formed in the second active region only between one side of the second gate electrode and one said isolation trench.

20. The semiconductor device of claim 15, wherein the second gate electrode is substantially equal in dimension along the gate length to the first gate electrode.

* * * * *